United States Patent
Ketterson et al.

(10) Patent No.: US 11,621,111 B2
(45) Date of Patent: Apr. 4, 2023

(54) STRATEGIES TO PERFORM MAGNETIZATION REVERSALS IN FERROMAGNETS

(71) Applicant: NORTHWESTERN UNIVERSITY, Evanston, IL (US)

(72) Inventors: John B. Ketterson, Evanston, IL (US); Anupam K. Garg, Wilmette, IL (US); Jinho Lim, Evanston, IL (US); Zhaohui Zhang, Oak Park, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 20 days.

(21) Appl. No.: 17/483,405

(22) Filed: Sep. 23, 2021

(65) Prior Publication Data

US 2022/0093306 A1 Mar. 24, 2022

Related U.S. Application Data

(60) Provisional application No. 63/082,266, filed on Sep. 23, 2020.

(51) Int. Cl.
*H01F 13/00* (2006.01)
(52) U.S. Cl.
CPC .................. *H01F 13/006* (2013.01)
(58) Field of Classification Search
CPC .. H01F 10/325; H01F 10/3254; H01F 13/006; G01R 33/3875; G01R 33/54; G01R 33/482; G01R 33/445; G01R 33/093; G01R 33/60; G01R 33/3802; G01R 33/3808; G01R 33/56; G11C 11/161; G11C 11/16; G11C 11/1675; H01L 43/08
See application file for complete search history.

(56) References Cited

U.S. PATENT DOCUMENTS

2018/0102475 A1* 4/2018 Shibata ................ H01F 10/329

OTHER PUBLICATIONS

C.L. Jermain, S.V. Aradhya, N.D. Reynolds, R.A. Buhrman, J.T. Brangham, M.R. Page, P.C. Hammel, F.Y. Yang and D.C. Ralph, "Increased low-temperature damping in yttrium iron garnet thin films", Phys. Rev. B 95 (17), 174411, 2017. DOI: 10.1103/PhysRevB. 95.17441.

(Continued)

*Primary Examiner* — Bryan R Perez
(74) *Attorney, Agent, or Firm* — Benesch, Friedlander, Coplan & Aronoff LLP

(57) ABSTRACT

Systems and methods for reversing a magnetization in a ferromagnet include a nanometer-scale cylindrical ferromagnetic sample having a height to diameter aspect ratio on the order of 2 or greater. A temporally-varying external field comprising an r.f. Pi pulse is applied to the ferromagnetic sample to cause a precession magnetization vector inclined at an angle with respect to the longest axis of the ferromagnetic sample to continuously rotate around the longest axis. One or more parameters of the temporally-varying external field is continuously adjusted based on at least magnetization dynamics of the ferromagnetic sample and/or an angular dependence of a precession frequency of the ferromagnetic sample.

20 Claims, 23 Drawing Sheets

(56) References Cited

OTHER PUBLICATIONS

M.J. Donahue and D.G. Porter, OOMMF User's Guide, Version 1.0, Interagency Report NISTIR 6376, U.S. Department of Commerce, National Institute of Standards and Technology, Gaithersburg, MD, Sep. 1999.

L.D. Landau, E.M. Lifshits and L.P. Pitaevskii, Statistical physics, Part II, Pergamon Press, Oxford, New York, Section 69, 1980.

Y. Li, V.V. Naletov, O. Klein, J.L. Prieto, M. Munoz, V. Cros, P. Bortolotti, A. Anane, C. Serpico and G. de Loubens, "Nutation Spectroscopy of a Nanomagnet Driven into Deeply Nonlinear Ferromagnetic Resonance", Phys. Rev. X 9 (4), 041036, 2019. DOI: 10.1103/PhysRevX.9.041036.

A.G. Gurevich and G.A. Melkov, Magnetization oscillations and waves, CRC Press, Boca Raton, 1996.

H. Suto, T. Kanao, T. Nagasawa, K. Mizushima and R. Sato, "Zero-dc-field rotation-direction-dependent magnetization switching induced by a circularly polarized microwave magnetic field", Sci. Rep. 7 (1), 13804 (2017). DOI: 10.1038/s41598-017-13770-w.

H. Suto, T. Nagasawa, K. Kudo, T. Kanao, K. Mizushima and R. Sato, "Layer-Selective Switching of a Double-Layer Perpendicular Magnetic Nanodot Using Microwave Assistance", Phys. Rev. Appl. 5 (1), 014003, 2016. DOI: 10.1103/PhysRevApplied.5.014003.

T. Schrefl, M.E. Schabes, D. Suess and M. Stehno, "Dynamic micromagnetic write head fields during magnetic recording in granular media", IEEE Trans. Magn. 40 (4), 2004, pp. 2341-2343. DOI: 10.1109/Tmag.2004 832467.

I. N. Krivorotov, D.V. Berkov, N.L. Gorn, N.C. Emley, J.C. Sankey, D.C. Ralph and RA. Buhrman, "Large-amplitude coherent spin waves excited by spin-polarized current in nanoscale spin valves", Phys. Rev. B 76 (2), 024418, 2007. DOI: 10.1103/PhysRevB.76.024418.

T. Gerrits, M.L. Schneider, A. B. Kos and T. J. Silva, "Large-angle magnetization dynamics measured by time-resolved ferromagnetic resonance", Phys. Rev B 73 (9), 094454, 2006. DOI: 10.1103/PhysRevB.73.094454.

C. Kittel, "On the Theory of Ferromagnetic Resonance Absorption", Phys. Rev. 73 (2), 1948, pp. 155-161. DOI: 10.1103/PhysRev.73.155.

M. Sato and Y. Ishii, "Simple and Approximate Expressions of Demagnetizing Factors of Uniformly Magnetized Rectangular Rod and Cylinder", J. Appl. Phys. 66 (2), 1989, pp. 983-985. DOI: 10.1063/1.343481.

A. S. Arrott, B. Heinrich, T. L. Templeton and A. Aharoni, "Micromagnetics of Curling Configurations in Magnetically Soft Cylinders", J. Appl. Phys. 50 (3), 1979, pp. 2387-2389. DOI 10.1063/1.326961.

W. S. Ament and G. T. Rado, "Electromagnetic Effects of Spin Wave Resonance in Ferromagnetic Metals", Phys. Rev. 97 (6), 1955, pp. 1558-1566. DOI: 10.1103/PhysRev.97.1558.

C. Sun and W. M. Saslow, "Strongly coupled modes of M and H for perpendicular resonance", Phys. Rev. B 97 (17), 174411 (2018). DOI: 10.1103/PhysRevB.97.174411.

W. F. Brown, Magnetostatic principles in ferromagnetism, North-Holland Pub. Co.; Interscience Publishers, Amsterdam, New York, 1962, Appendix A.

R. I. Joseph, "Ballistic Demagnetizing Factor in Uniformly Magnetized Cylinders", J. Appl. Phys. 37 (13), 4639, 1966. DOI: 10.1063/1.1708110.

A. Aharoni, "Demagnetizing factors for rectangular ferromagnetic prisms", J. Appl. Phys. 83 (6), 1988, pp. 3432-3434. DOI: 10.1063/1367113.

R. I. Joseph and Schloman.E, "Demagnetizing Field in Nonellipsoidal Bodies", J. Appl. Phys. 36 (5), 1579 (1965). DOI: 10.1063/1.1703091.

L. R. Walker, "Magnetosiatic Modes in Ferromagnetic Resonance", Phys. Rev. 105 (2), 1957, pp. 390-399. DOI 10.1 I03/PhysRev.105.390.

L. R. Walker, "Resonant Modes of Ferromagnetic Spheroids", J. Appl. Phys. 29 (3), 1958, pp. 318-323. DOI 10.1063/1.1723117.

R. Arias and D. L. Mills. "Theory of spin excitations and the microwave response of cylindrical ferromagnetic nanowires", Phys. Rev. B 63 (13), 2001. ARTN 134439 DOI 10.1103/PhysRevB.63.134439.

H. Suhl, "The Theory of Ferromagnetic Resonance at High Signal Powers". J. Phys. Chem. Solids 1 (4), 1957, pp. 209-227. DOI 10.1016/0022-3697(57)90010-0.

H. Suhl. "Origin and Use of Instabilities in Ferromagnetic Resonance", J. Appl. Phys. 29 (3), 1958, pp. 416-420. DOI 10.1063/1.1723162.

Lim, Zhang, Garg, Ketterson, "Pi Pulses in a Ferromagnet: Simulations for Yttrium Iron Garnet", Journal of Magnetism and Magnetic Materials 527 (2021) 167787.

S. Rohart and A Thiaville, "Skyrmion confinement in ultrathin film nanostructures in the presence of Dzyaloshinskii-Moriya interaction", Phys. Rev. B 88 (18), 2013. ARTN 184422 10.103/PhysRevB.88.184422.

L. D. Landau and E. M. Lifshitz, "On the theory of the dispersion of magnetic permeability in ferromagnetic bodies", Phys. Z Sowjet 8, 153-169, 1935.

A. G. Gurevich and G.A. Melkov, Magnetization Oscillations and Waves, CRC Press, Boca Raton, 1996. 0849394600.

W.F. Brown, "Micromagnetics", Interscience Publishers, New York, 1963.

J.E. Miltat and M.J. Donahue, "Numerical Micromagnetics: finite difference methods", in Handbook of magnetism and advanced magnetic materials, edited by H. Kronmuller and S. Parkin (John Wiley & Sons, Hoboken, NJ, 2007), vol. 2, pp. 742-764. 10.1002/9780470022184.hmm202.

W.F. Brown, Magnetostatic principles in ferromagnetism, North-Holland Pub. Co.: Interscience Publishers, Amsterdam, New York, 1962.

A.S. Arrott, B. Heinrich, T.L. Templeton and A. Aharoni, "Macromagnetics of Cuding Configurations in Magnetically Soft Cylinders", J. Appl. Phys. 50 (3), 1979, pp. 2387-2389. DOI 10.1063/1.326961.

G.S. Abo, Y.K. Hong, J. Park, J. Lee, W. Lee and B.C. Choi, "Definition of Magnetic Exchange Length", IEEE Trans. Magn. 49 (8), 2013, p. 4937-4939. 10.1109/Tmag.2013.2258028.

H.Y. Carr and E.M. Purcell, "Effects of Diffusion on Free Precession in Nuclear Magnetic Resonance Experiments", Phys. Rev. 94 (3), 1954, pp. 630-638. DOI 10.1103/PhysRev.94.630.

J.G. Zhu, X.C. Zhu and Y.H. Tang, "Microwave assisted magnetic recording", IEEE Trans. Magn. 44 (1), 2008, pp. 125-131. 10.1109/Tmag.2007.911031.

S. Okamoto, N. Kikuchi, M. Furuta, O. Kitakami and T. Shimatsu, "Microwave assisted magnetic recording technologies and related physics", J. Phys. D Appl. Phys. 48 (35), 2015, Artn 353001 10.1088/0022-3727/48/35/353001.

H. Suto, T. Kanao, T. Nagasawa, K. Mizushima and R. Sato, "Zero-de-field rotation-direction-dependent magnetization switching induced by a circularly polarized microwave magnetic field", Sci. Rep. 7, 2017. ARTN 13804 10.1038/s41598-017-13770-w.

H. Suto, T. Kanao, T. Nagasawa, K. Mizushima and R. Sato, "Magnetization Switching of a Co/Pt Multilayered Perpendicular Nanomagnet Assisted by a Microwave Field with Time-Varying Frequency", Phys. Rev. Appl. 9 (5), 2018. ARTN 054011 10.1103/PhysRevApplied.9.054011.

E. L. Hahn, "Spin Echoes", Phys. Rev. 80 (4), 1950, pp. 580-594. DOI 10.1103/PhysRev.80.580.

A. Abragam, "The principles of nuclear magnetism", Clarendon Press, Oxford, 1961.

E. Fukushima and S. B. W. Roeder, "Experimental pulse NAIR: a nuts and bolts approach", Addison-Wesley Pub. Co., Advanced Book Program, Reading, Mass., 1981.

C. P. Slichter, "Principles of magnetic resonance, with examples from solid state physics", Harper & Row, New York, 1963.

R. W. Damon, "Ferromagnetic Resonance at High Power", in Magnetism, edited by G.T. Rado and H. Suhl, Academic Press, New York, 1963, vol. 1, Chap. 11, pp. 552-620.

(56) References Cited

OTHER PUBLICATIONS

P.W. Anderson and H. Suhl, "Instability in the Motion of Ferromagnets at High Microwave Power Levels", Phys. Rev. 100 (6), 1955, pp. 1788-1790. DOI: 10.1103/PhysRev.100.1788.
H. Suhl, "The Nonlinear Behavior of Ferrites at High Microwave Signal Levels", P Ire 44 (10), 1956, p. 1270-1284. DOI: 10.1109/Jrproc.1956.274950.
J. E. Mercereau and R.P. Feynman, "Physical Conditions for Ferromagnetic Resonance", Phys. Rev. 104 (1), 1959, pp. 63-63 DOI: 10.1103/PhysRev.104.63.
L. R Walker, "Magnetostatic Modes in Ferromagnetic Resonance", Phys. Rev. 105 (2), 1957, pp. 390-399. DOI: 10.1103/PhysRev.105.390.
R. W. Damon and J. R. Eshbach, "Magnetostatic Modes of a Ferromagnet Slab", J. Phys. Chem. Solids 19 (3-4), 1961, pp. 308-320 DOI: 10.1016/0022-3697(61)90041-5.
G. J. Lim, W. Bang, J. Trossman, A. Kreisel, M.B. Jungfleisch, A. Hoffmann, C.C. Tsai and J.B. Ketterson, "Direct detection of multiple backward volume modes in yttrium iron garnet at micron scale wavelengths", Phys. Rev. B 99 (1), 014435, 2019, 5 pages. DOI: 10.1103/PhysRevB.99.014435.
R. Arias and D. L. Mills, "Theory of spin excitations and the microwave response of cylindrical ferromagnetic nanowires", Phys. Rev B 63 (13), 134439 (2001), 11 pages.
R.I. Joseph, and E. Schlomann, "Theory of Magnetostatic Modes in Long, Axially Magnetized Cylinders", J. Appl. Phys. 32 (6), 1001 (1961), 6 pages.
M. Krawczyk and D. Grundler, "Review and prospects of magnonic crystals and devices with reprogrammable band stucture", J. Phys. Condens. Matter 26 (12), 123202 (2014) DOI: 10 1088/0953-8984/26/12/123202.
S. Jung, B. Watkins, L DeLong, J.B. Ketterson and V. Chandrasekhar, "Ferromagnetic resonance in periodic particle arrays", Phys. Rev. B 66 (13), 132401 (2002). DOI 10.1103/PhysRevB.66.132401.
W. Bang, F. Montoncello, M.T. Kaffash, A. Hoffmann, J.B. Ketterson and M.B. Jungfleisch, "Ferromagnetic resonance spectra of permalloy nano-ellipses as building blocks for complex magnonic lattices", J. Appl. Phys. 126 (20), 203902 (2019). DOI: 10.1063/1.5126679.
H. Suto, T. Kanao, T. Nagasawa, K. Mizushima and R. Sato, "Magnetization Switching of a Co/Pt Multilayered Perpendicular Nanomagnet Assisted by a Microwave Field with Time-Varying Frequency", Phys. Rev. Appl. 9 (5), 054011 (2018). DOI: 0.1103/PhysRevApplied.9.054011.
J. G. Zhu, X. C. Zhu and Y. H. Tang, "Microwave assisted magnetic recording", IEEE Trans. Magn. 44 (1), 125-131 (2008). DOI: 10.1109/Tmag.2007.911031.
K. Rivkin, M. Benakli, N. Tabat and H.Q. Yin, "Physical principles of microwave assisted magnetic recording", J. Appl. Phys. 115 (21), 214312 (2014) DOI: 10 1063/1.4882063.
S. Okamoto, N. Kikuchi, M. Furuta, O. Kitakami and T. Shimatsu, "Microwave assisted magnetic recording technologies and related physics", J. Phys. D Appl. Phys. 48 (35), 353001 (2015). DOI 10.1088/0022-3727/48/35/353001.
K. Rivkin, N. Tabat and S. Foss-Schroeder, "Time-dependent fields and anisotropy dominated magnetic media", Appl. Phys. Lett. 92 (15), 153104 (2008). DOI: 10.1063/1.2907504.
S. Probst, V. Ranjan, Q. Ansel, R. Heeres, B. Albanese, E. Albertinale, D. Vion, D. Esteve, S.J. Glaser, D. Sugny and P. Bertet, "Shaped pulses for transient compensation in quantum-limited electron spin resonance spectroscopy", J. Magn. Reson, 303, 2019, pp. 42-47. DOI: 10.1016/j.jmr.2019.04.008.
K. Rivkin and J.B. Ketterson, "Magnetization reversal in the anisotropy-dominated regime using time-dependent magnetic fields", Appl. Phys. Lett. 89 (25 ), 252507, 2006. DOI: 10.1063/1.2405855.
K. Rivkin and J.B. Ketterson, "Switching spin valves using rf currents", Appl. Phys. Lett. 88 (19), 192515, 2006. DOI: 10.1063/1.2199456.
Z.H. Wang and M.Z. Wu, "Chirped-microwave assisted magnetization reversal", J. Appl. Phys. 105 (9), 093903, 2009. DOI: 10.1063/1.3121075.
M.T. Islam, X.S. Wang, Y. Zhang and X.R. Wang, "Subnanosecond magnetization reversal of a magnetic nanoparticle driven by a chirp microwave field pulse", Phys. Rev. B 97 (22), 224412, 2018. DOI 10.1103/PhysRevB.97.224412.

* cited by examiner

STRATEGIES TO PERFORM MAGNETIZATION REVERSALS IN FERROMAGNETS

CROSS REFERENCE TO RELATED APPLICATIONS

The present application claims the benefit of priority under 35 U.S.C. § 119 from U.S. Provisional Patent Application Ser. No. 63/082,266, entitled "Strategy to Perform Magnetization Reversals in Ferromagnets," filed on Sep. 23, 2020, the disclosure of which is hereby incorporated by reference in its entirety for all purposes.

STATEMENT OF FEDERALLY FUNDED RESEARCH OR SPONSORSHIP

This invention was made with government support under grant number DE-SC0014424-0003 awarded by the Department of Energy (DOE). The government has certain rights in the invention.

TECHNICAL FIELD

The present disclosure generally relates to magnetization, and more specifically relates to performing magnetization reversals in ferromagnets.

BACKGROUND

Devices based on nuclear magnetic resonance (NMR) may have their internal magnetic fields overridden by electronically controlled external magnetic fields.

The description provided in the background section should not be assumed to be prior art merely because it is mentioned in or associated with the background section. The background section may include information that describes one or more aspects of the subject technology.

SUMMARY

An exemplary method for performing magnetization reversals in ferromagnets includes providing a cylindrical ferromagnetic sample having a height dimension along a z-axis that is larger than a diameter dimension in an x-y plane that is perpendicular to the z-axis. The x-y plane is defined by an x-axis that is perpendicular to the z-axis and a y-axis that is perpendicular to both the z-axis and the x-axis. The method also includes applying a temporally-varying external field comprising a chirped r.f. Pi pulse to the ferromagnetic sample along a direction perpendicular to the z-axis in the x-y plane. The x-axis component and a y-axis component of the temporally-varying external field each have a magnitude that temporally varies according to a different function of time to cause the temporally-varying external field to continuously rotate a precession magnetization vector around the z-axis. The precession magnetization vector is inclined at an angle with respect to the z-axis. The method further includes sweeping a frequency of the chirped r.f. Pi pulse based on an instantaneous precession frequency and a corresponding angle of inclination of the precession magnetization vector.

The method may further include applying a static non-zero external field to the ferromagnetic sample along a direction of the z-axis.

The method may further include applying a static non-zero external field having a magnitude of at least 2000 Oe to the ferromagnetic sample along a direction of the z-axis.

The method may further include adjusting operational parameters for chirping the r.f. pulse applied to the ferromagnetic sample based on an angular dependence of the precession frequency.

Providing the ferromagnetic sample may include providing a ferromagnetic sample having a height dimension along a z-axis that is 150 nm or less and that is at least twice the diameter dimension in the x-y plane.

Providing the ferromagnetic sample may include providing a ferromagnetic sample having a height dimension along a z-axis that is 50 nm or less and that is at least twice the diameter dimension in the x-y plane.

Providing the ferromagnetic sample may include providing an yttrium iron garnet (YIG) sample having uniaxial shape anisotropy.

Applying an external field comprising a chirped r.f. Pi pulse may include applying a circularly polarized field.

The applied external field comprising the chirped r.f. Pi pulse may have a magnitude of at least 200 Oe.

An exemplary method for performing magnetization reversals in ferromagnets includes providing a cylindrical ferromagnetic sample having a height dimension along a z-axis that is larger than a diameter dimension in an x-y plane that is perpendicular to the z-axis, the x-y plane defined by an x-axis that is perpendicular to the z-axis and a y-axis that is perpendicular to both the z-axis and the x-axis. The method also includes applying a temporally-varying external field comprising a constant-frequency r.f. Pi pulse to the ferromagnetic sample along a direction perpendicular to the z-axis in the x-y plane, an x-axis component and a y-axis component of the temporally-varying external field each having a magnitude that temporally varies according to a different function of time to cause the temporally-varying external field to continuously rotate a precession magnetization vector around the z-axis, the precession magnetization vector being inclined at an angle with respect to the z-axis. The method further includes applying a temporally-varying external field that includes a temporally-varying magnitude of a z-axis component to the ferromagnetic sample along a direction of the z-axis. The method further includes sweeping a magnitude of the constant-frequency r.f. Pi pulse based on an instantaneous precession frequency and a corresponding angle of inclination of the precession magnetization vector.

Applying the temporally-varying external field along a direction perpendicular to the z-axis in the x-y plane may include applying a circularly polarized field.

Applying the temporally-varying external field along a direction perpendicular to the z-axis in the x-y plane may include applying a linearly polarized field.

The method may further include adjusting operational parameters for at least one of the temporally-varying external fields along the z-axis or the x-y plane applied to the ferromagnetic sample based on an angular dependence of the precession frequency.

Providing the ferromagnetic sample may include providing a ferromagnetic sample having a height dimension along a z-axis that is 150 nm or less and that is at least twice the diameter dimension in the x-y plane.

Providing the ferromagnetic sample may include providing a ferromagnetic sample having a height dimension along a z-axis that is 50 nm or less and that is at least twice the diameter dimension in the x-y plane.

Providing the ferromagnetic sample may include providing an yttrium iron garnet (YIG) sample having uniaxial shape anisotropy.

The applied external field comprising the r.f. Pi pulse may have a magnitude of at least 200 Oe.

An exemplary system for reversing a magnetization in a ferromagnet includes a cylindrical ferromagnetic sample having a height dimension along a z-axis that is larger than a diameter dimension in an x-y plane that is perpendicular to the z-axis. The x-y plane is defined by an x-axis that is perpendicular to the z-axis and a y-axis that is perpendicular to both the z-axis and the x-axis. A first magnet field generator is configured to apply a temporally-varying external field comprising an r.f. Pi pulse to the ferromagnetic sample along a direction perpendicular to the z-axis in the x-y plane, an x-axis component and a y-axis component of the temporally-varying external field each having a magnitude that temporally varies according to a different function of time to cause the temporally-varying external field to continuously rotate a precession magnetization vector around the z-axis, the precession magnetization vector being inclined at an angle with respect to the z-axis. The system includes a computer configured to control the magnetic field generator to continuously vary one or more parameters of the temporally-varying external field comprising an r.f. Pi pulse to the ferromagnetic sample along a direction perpendicular to the z-axis in the x-y plane, based on an angular dependence of a precession frequency of the ferromagnetic sample. The system also includes magnetization dynamics of the ferromagnetic sample.

The computer may control the magnetic field generator based on measurement data received from the sensor.

The system may include a sensor for measuring magnetization dynamics of the ferromagnetic sample.

The computer may control the magnetic field generator based on measurement data received from the sensor.

BRIEF DESCRIPTION OF DRAWINGS

The disclosure is better understood with reference to the following drawings and description. The elements in the figures are not necessarily to scale, emphasis instead being placed upon illustrating the principles of the disclosure. Moreover, in the figures, like-referenced numerals may designate to corresponding parts throughout the different views.

Figure 1B:
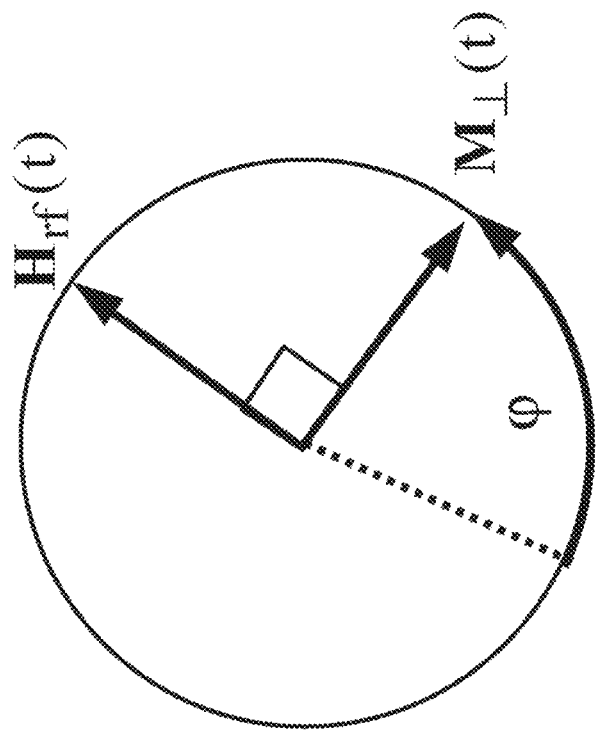
FIG. 1B illustrates an exemplary precession plane showing the r.f. field $H_{rf}(t)$ 90° ahead of the perpendicular component of the magnetization $M\perp(t)$ in a configuration of maximum torque.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

I. Introduction

The disclosed technologies may facilitate near-perfect reversal of a direction of magnetization in a ferromagnet, provided that the ferromagnet sample is sufficiently small and the angular dependence of the precession frequency is continuously matched using an appropriately "chirped" radio frequency (r.f.) pulse of an appropriate length, or maintaining a constant frequency in the r.f. pulse while sweeping the magnitude of an applied longitudinal field. The r.f. pulse may be referred to as a Pi pulse. Such reversals may be performed in the presence of a static external magnetic field, or at zero field under the sample's own internal demagnetization field. However, the ability to perform near-perfect Pi rotations may be lost for samples above certain dimensions for which additional internal degrees of freedom are excited, particularly at higher static fields. In such larger samples, the magnetization may still be reversed by utilizing damping, provided the average magnetization can be rotated past a critical angle. Examples described herein include "prolate" uniaxially symmetric cylindrical samples in the presence of dipole and exchange interactions.

Nuclear Magnetic Resonance (NMR) has been primarily employed using large angle rotations of the magnetization in a static external magnetic field that are produced by r.f. pulses which, in turn, produce delayed responses, so-called "echoes" from which subtle effects associated with various internal fields and different relaxation mechanisms may be extracted [1-4]. Electron Spin Resonance (ESR) has also been employed using similar methodologies. However, such large angle spin rotation methodologies have not been employed by the Ferro-Magnetic Resonance (FMR) community. Several reasons for this are discussed below.

Early experiments on ferromagnetic resonance carried out at high amplitudes showed the presence of an additional resonance line [5]. The origin of this effect was ultimately traced to the parametric excitation of inhomogeneous dynamic states of the magnetization, in which the restoring torque is primarily dipolar in character and nominally having half the frequency of the driven uniform mode, to which the magnetization may couple above some threshold r.f. field. In the language of non-linear optics (NLO), this effect may arise from a second order susceptibility, $\chi^{(2)}$. Subsequent calculations for the case of a sphere [10] and an ellipsoid of revolution [11, 12] found these dipolar modes; the latter are now commonly called Walker modes. The mode structure for the case of rectangular platelets was later calculated by Damon and Eshbach [13, 14]; here a clear distinction emerges between surface and bulk modes—the latter being more numerous.

Suhl also identified another kind of threshold above which the absorption arising from the uniform mode rapidly saturates. This may come from a coupling of the uniform mode to finite-wavevector dipole-exchange modes having the same frequency, which enters in third order, i.e., from $\chi^{(3)}$ in the NLO analogy. Such modes may be possible due to, depending on the mode numbers, the dipole and exchange effects canceling each other, thereby leading to modes that are degenerate (or nearly degenerate) with the uniform mode.

The existence of the processes described herein may limit the growth of the precession angle with applied r.f. field by causing the magnetization to "break up" into one or more non-uniform modes. In particular, their presence may prevent coherently rotating the magnetization through 180° by the application of a so-called Pi pulse, and with the presence of non-uniform modes, the opportunity to apply the spin echo techniques referred to above. The technologies described herein include strategies to avoid or circumvent the break-up phenomena in order to perform large angle rotations, such as those exploited in NMR spin echo experiments.

One strategy to avoid siphoning off the applied power into other available modes, for example, those involving parametric excitation, may include using large r.f. fields so that the rotation may be completed before the modes can build up (note that, e.g., a system may be metastable in a reverse magnetized state). A second strategy may include moving the resonating modes sufficiently far away that they may not be excited. Technologies described herein may facilitate large angle rotations, for example, by shrinking the sample size [15]. Aiding us here is that the exchange interaction may favor overall parallel spin alignment in smaller samples at all rotation angles; e.g., the smaller samples may resist the differential spin rotation for forming the nodes associated with the excitation of other modes, moving them to higher frequencies. In addition, sufficiently small samples may be single domain at zero external field and may tend to remain aligned at all precession angles. Note that the Suhl analysis was limited (e.g., by algebraic complexity) to relatively small tipping angles of the magnetization, whereas the technologies described herein may involve all angles. This regime has been largely unexplored previously.

The disclosed technologies include strategies involving reducing sample size that were not previously considered practical or likely to achieve the results disclosed herein. For example, sample sizes for the disclosed technologies lie in the 100 nm range and below [16], leading to a tendency to dismiss such approaches as impractical [17]. However, the disclosed technologies may innovatively apply analyses of resonant responses of periodic (e.g., to facilitate easy detection) arrays of patterned magnetic structures [18], for example, holes in continuous films and isolated "dots" of various shapes [19, 20], influenced by e-beam-based patterning strategies to write nano-meter scale magnetic structures. The disclosed technologies may also innovatively apply techniques to measure the dynamic properties of individual nano-scale particles, using properties such as the spin Hall effect [21].

For some time, there has been an interest in the magnetic recording community to modify the writing of individual memory bits on disc tracks by the application of a pulsed field (e.g., flat-topped in the usual approach) together with a single-frequency r.f. burst, so-called microwave assisted switching [22-25]. However, this has largely been carried out as a "brute force" operation rather than a controlled process.

The examples described herein relate primarily to cylindrical samples of yttrium iron garnet (YIG), with several different aspect ratios and overall sizes, including those having dimensions below 100 nm, with larger sizes displaying instabilities. However, these examples should not be considered limiting, as the technologies described herein may also be applied to other materials and sizes. The examples presented herein relate to YIG samples simply because YIG may have extremely low damping relative to other materials, thereby providing long time periods in which to perform the magnetization rotations. Thus, the examples utilizing YIG are illustrative of the disclosed technologies. The disclosed technologies may also utilize samples possessing uniaxial shape anisotropy so that the sample may have a defined magnetization direction (e.g., along one of two opposing directions) at zero field and may thereby serve as a memory element. The precession frequency may then be angular dependent, and optimally rotating the magnetization may involve sweeping the applied frequency [26], a process generally referred to as "chirping" [27-30]. The range of frequencies involved may be large, e.g., on the order of a factor of two (2). However, this range of frequencies is not a barrier [31], at least because commercial chirped signal sources are available.

Precession-assisted quantum tunneling and related phenomena may be studied in small YIG nanostructures and associated arrays at low temperatures. In thin films, this may be hampered by anomalous damping [32] observed in YIG materials at low temperatures, presumably arising from the coupling to fluctuating Gd moments in gadolinium gallium garnet (GGG) substrates used to prepare YIG films.

The remainder of the present disclosure is organized as follows: In Section II we describe a computational strategy for analysis of the disclosed technologies, including an algorithm utilized to lock the applied r.f. frequency and its phase, e.g., the chirp profile, to the angle-dependent precession frequency of the magnetization which the algorithm generates, to continuously rotate the magnetization. In Section III we present some numerical results for an initial distribution of the equilibrium magnetization, which may serve as a starting point for rotation simulations. In section IV we show exemplary simulations demonstrating near-perfect Pi and 2Pi rotations of the magnetization in small cylinders of YIG, both with and without an external magnetic field. The disclosed results indicate that for smaller samples, which may be dominantly "exchange locked," large precession angle dynamics of the exemplary cylindrical samples may be accurately modeled by regarding the system as a single macro spin and directly integrating the Landau-Lifshitz equation, which is discussed in Section V. The large precession angle dynamics may also be described analytically as is discussed in Appendix A. Section VI describes exemplary situations, including those involving larger samples, where there may be instabilities and large angle rotations may fail, along with some possible origins of this problem. Additional applications and extensions of the disclosed technologies are also discussed. Section VII introduces a second methodology for rotating magnetization in ferromagnetic samples via keeping the microwave frequency constant (rather than chirping it as discussed in the prior sections) and sweeping the magnitude of an applied longitudinal field. Section VIII discusses an exemplary micromagnetic simulation setup for the second methodology involving sweeping the magnitude of the applied longitudinal field. Section IX discusses micromagnetic simulations of large angle magnetization rotations with a circularly polarized microwave field. Section X discusses micromagnetic simulations of large angle magnetization rotations with a linearly polarized microwave field. Section XI wraps up and concludes the discussions. Section XII includes the Appendix discussing the perfect homogeneity approximation. Section XIII includes references.

II. Computational Strategy

Simulations may be carried out with the OOMMF (Object Oriented MicroMagnetic Framework) software package developed and maintained by the United States National Institute for Standards and Technology (NIST) [33, 56]. Briefly, OOMMF may divide a sample into discrete cells having discrete magnetic moments (e.g., representing a local average of the atomic spins). Each cell may interact with the cell's immediate neighbors via an exchange interaction, modeled by an accompanying parameter. In addition, each cell may interact with remaining cells (e.g., those that are not immediate neighbors of the cell) of the simulated sample through the magnetic dipole-dipole interaction. In general, other effects, such as crystalline anisotropy (which is not included in the exemplary simulations presented herein), may also be included in simulations.

The dynamics may be modeled by the Landau-Lifshitz (LL) equation [34]. For the $i^{th}$ cell, this may be written as $$\frac{dM_i}{dt} = -\gamma M_i \times H_i - \frac{\alpha\gamma}{M_0} M_i \times (M_i \times H_i), \qquad (1)$$

where $M_i$ is the magnetization, assumed constant in magnitude at $M_0$ within a given cell, $\gamma$ is the gyromagnetic ratio (taken to be a positive number), $H_i$ is the total magnetic field, and $\alpha$ is a dimensionless parameter modeling the damping. The fields included here are those arising from external direct current (d.c.) and r.f. fields and, as already noted, the internal dipole and exchange fields arising from other cells. At any instant, the torque in the Landau-Lifshitz equation may be evaluated for each cell of the array and used to advance the magnetization to its orientation for the next time step [35]. When modeling the behavior with a single spin, the dipolar field may be incorporated in terms of a demagnetization tensor, as discussed in Appendix A.

Simulations may begin with establishing an equilibrium configuration, for example, by: i) choosing random orientations for the orientations of the individual cells and then letting the system dynamically evolve (in the presence of damping) until the system simulation stabilizes in some configuration, or ii) aligning all the spins in some "starting" direction(s) and relaxing them from there. These simulations may be carried out with or without a static external field. Other initial conditions may be chosen to examine whether the simulated system is being trapped in a metastable state, which may be accessed through the total energy, which may also be delivered by the OOMMF program. In the simulations utilizing OOMMF disclosed herein, after the initial equilibrium is achieved, an external time-dependent field may be applied according to an exemplary prescription and the time evolution of the system may then be monitored (which may also delivered in real time by the OOMMF program).

Figure 1A:
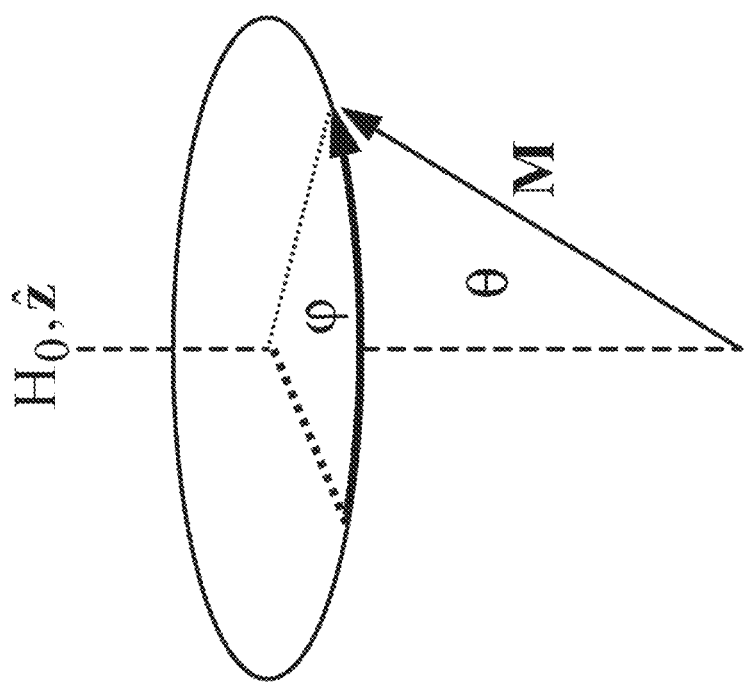
FIG. 1A illustrates an exemplary three-dimensional projection showing a processing magnetization vector M tipped at an angle θ with respect to the z axis and making an angle φ in the x-y plane.

FIG. 1A illustrates an exemplary three-dimensional projection showing a processing magnetization vector M tipped at an angle θ with respect to the z axis and making an angle φ in the x-y plane. FIG. 1B illustrates an exemplary precession plane showing the r.f. field $H_{rf}(t)$ 90° ahead of the perpendicular component of the magnetization $M_\perp(t)$ in a configuration of maximum torque. For enhancing the understanding of the following discussion of the overall motion of a system in time, three terms are introduced: precession, rotation, and nutation. If the magnetization M is inclined at some angle θ with respect to the internal field direction H, the torque associated with the Landau-Lifshitz equation may cause M to move about that direction at a rate $\dot\varphi$ which may be referred to as precession, where φ is measured from some convenient axis. On the other hand, the generally slower motion induced by an oscillatory external time-dependent field, $H_1(t)$, may cause θ to evolve in time (θ→θ(t)), which may be referred to as rotation. These angles are shown schematically in FIGS. 1A and 1B. If there is a mismatch between the precession frequency, ω(t), and the frequency associated with $H_1(t)$, $\omega_{rf}(t)$, so that the two move in and out of phase with respect to each other, the resulting motion in which θ varies non-monotonically may be referred to as nutation [36].

In the presence of an anisotropic internal demagnetization field, the instantaneous precession frequency, ω(t), may depend on the angle. To perform large angle (e.g., Pi) rotations, the applied r.f. frequency, $\omega_{rf}(t)=d\Phi(t)/dt$, where Φ(t) is the associated time-dependent phase, may be swept to match the instantaneous precession frequency at each angle to maintain maximal torque. However, the function Φ(t), together with the direction of the accompanying r.f. $H_1(t)$ field, may not be known in advance. To maintain the matching to achieve the desired result, a modification may be performed of the basic OOMMF code [37] to position $H_1$ perpendicular to the (sample-averaged) time-dependent magnetization M(t), in the plane of the precession (e.g., perpendicular to the net internal "static" field) at that instant, leading or lagging depending on the situation. This method may automatically generate the phase function Φ(t), the derivative of which may be the instantaneous chirp frequency ω(t). As illustrated in FIGS. 1A and 1B, when simulations are properly "locked" to optimally increase or decrease the rotation rate $\dot\theta(t)$, results may include $\Phi(t)=\varphi(t)\pm\pi/2$ modulo 2π.

For some of the calculations discussed below, it may be desirable to alter the parameter set under which a simulation is running, for example, midway into some calculation. As an example, suppose it is desired to relax some highly inhomogeneous internal magnetization distribution that has evolved during r.f. excitation to determine how the internal magnetization will evolve if allowed to fully relax. To do this efficiently, it may be desirable to enhance the damping at that point in time to "speed up" the relaxation into the final state. In this way, excessive running times may be avoided, for example, in small samples where the code may execute much slower (e.g., due to the more singular behavior of the exchange interaction for small cell separations). To achieve this, the code may be stopped, a file for the current state of the magnetization may be saved, and the saved file may be utilized for a new simulation run with an altered parameter set. To enhance the damping, for example, the damping parameter a may be simply increased.

III. Equilibrium Magnetization

Figure 2:
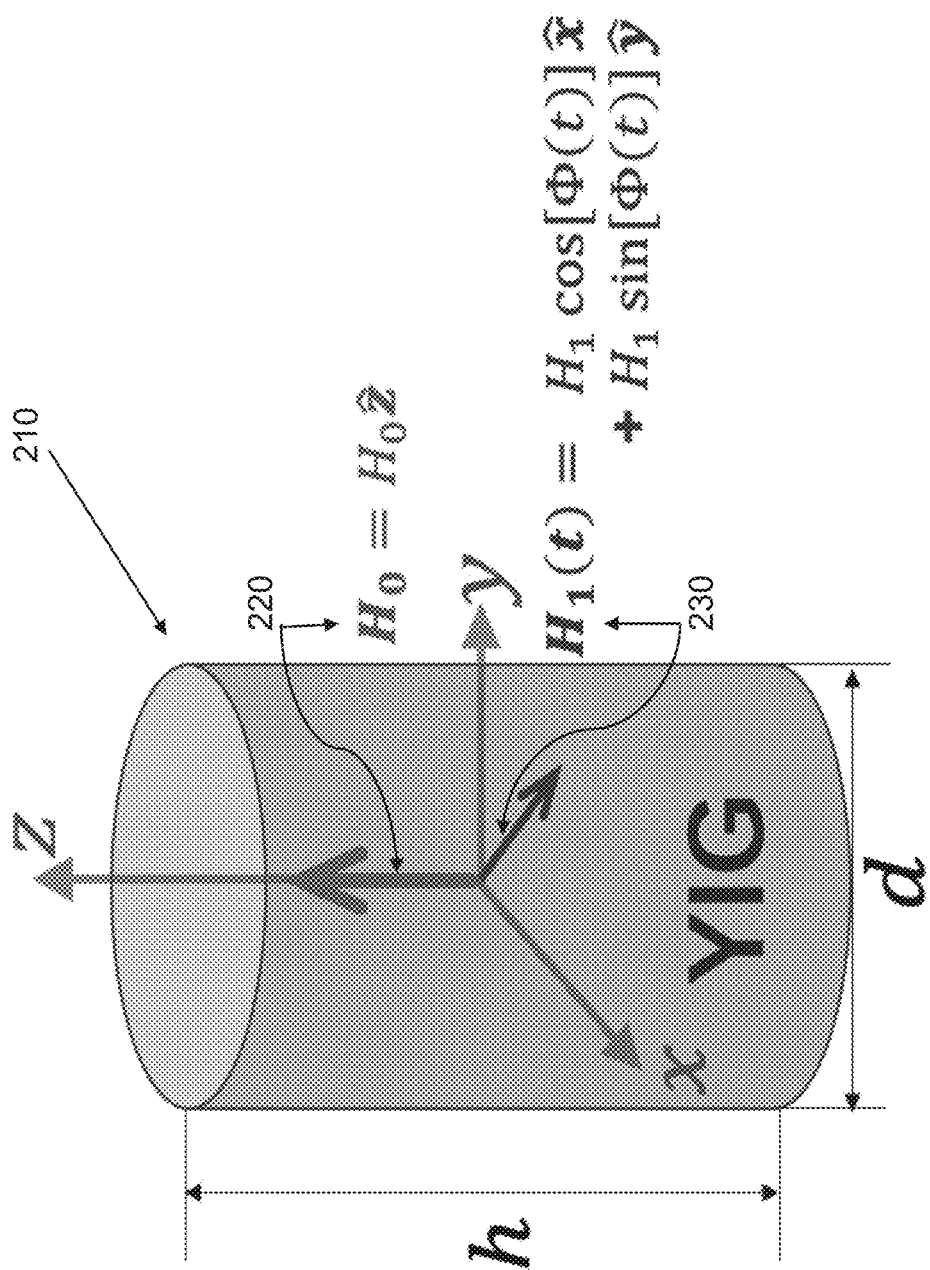
FIG. 2 illustrates an exemplary sample geometry of a YIG sample together with applied fields used in exemplary OOMMF simulations.

FIG. 2 illustrates an exemplary sample geometry of a YIG sample 210 together with applied fields 220 and 230 used in exemplary OOMMF simulations. The applied field 220 may be represented as $H_0=H_0\hat{z}$. The applied field 230 may be represented as $H_1(t)=H_1 \cos[\phi(t)]\hat{x}+H_1 \sin[\phi(t)]\hat{y}$. The material parameters used [38] may be typical for Yttrium Iron Garnet (YIG): $\gamma=2\pi\times2.8$ GHz/kOe, saturation magnetization $M_s=139$ emu/cm$^3$, damping constant $\alpha=5\times10^{-5}$, and exchange stiffness constant $A=3.5\times10^{-7}$ erg/cm. Since a potential application of the technologies described herein includes magnetic memory elements, shape anisotropy may be incorporated to define a direction, for example, along the long axis. Most exemplary simulations described herein were performed for right circular cylinders 25 nm in diameter d and 50 nm in height h. As discussed in the next section, the magnetization in such samples may be reversed by an appropriately chirped Pi pulse. Exemplary simulations were also performed with larger samples.

Figure 3:
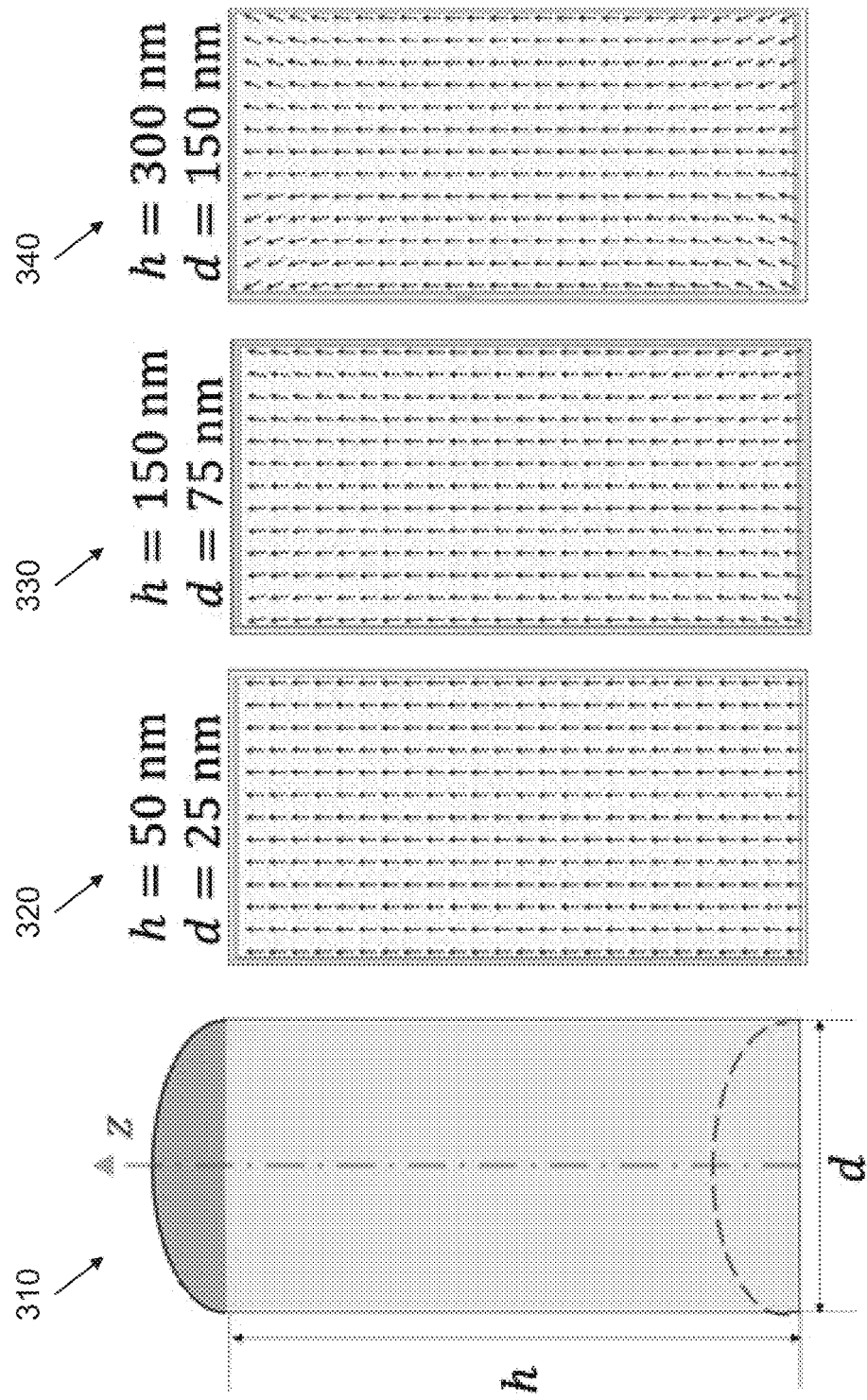
FIG. 3 illustrates an exemplary cross-section of a relaxed magnetization distribution, e.g., the equilibrium orientation of the spins within the cross-section containing the z axis, for three samples having three different sizes while maintaining the geometric ratio h/d=2.

Generally, the more inhomogeneous the initial magnetization, the less effectively large angle rotations may be performed. Therefore, the static distribution of magnetization of a sample having particular dimensions may be characterized before attempting to rotate the magnetization of the sample. FIG. 3 illustrates an exemplary cross-section of a relaxed magnetization distribution, e.g., the equilibrium orientation of the spins within the cross-section containing the z axis, for three samples 320, 330, 340 having three different sizes while maintaining the geometric ratio h/d=2. The sizes of the three samples 320, 330, 340 are all scaled based on a cylindrical sample template 310. Each of the samples 320, 330, 340 have the same height to diameter ratio of h/d=2. Although the magnetization of the three samples is quite uniform, note that the spins increasingly flare in/out at the ends as the samples 320, 330, 340 get larger. The flaring at the ends (e.g., where flaring may be most expected) clearly increases for larger sizes due to the reduced effect of the exchange interaction. Having established the equilibrium configuration of the magnetization in the exemplary samples, computer rotation experiments may be performed, both with and without damping.

IV. Simulating Large Angle Magnetization Rotations

In this and the following section, a selection of numerical simulations summarizing various behaviors encountered when performing large angle rotations of the magnetization with and without chirping and for various sample sizes are presented. As a guide and quick reference, Table I summarizes the different cases examined.

TABLE I

Exemplary simulation results

Figure 11:
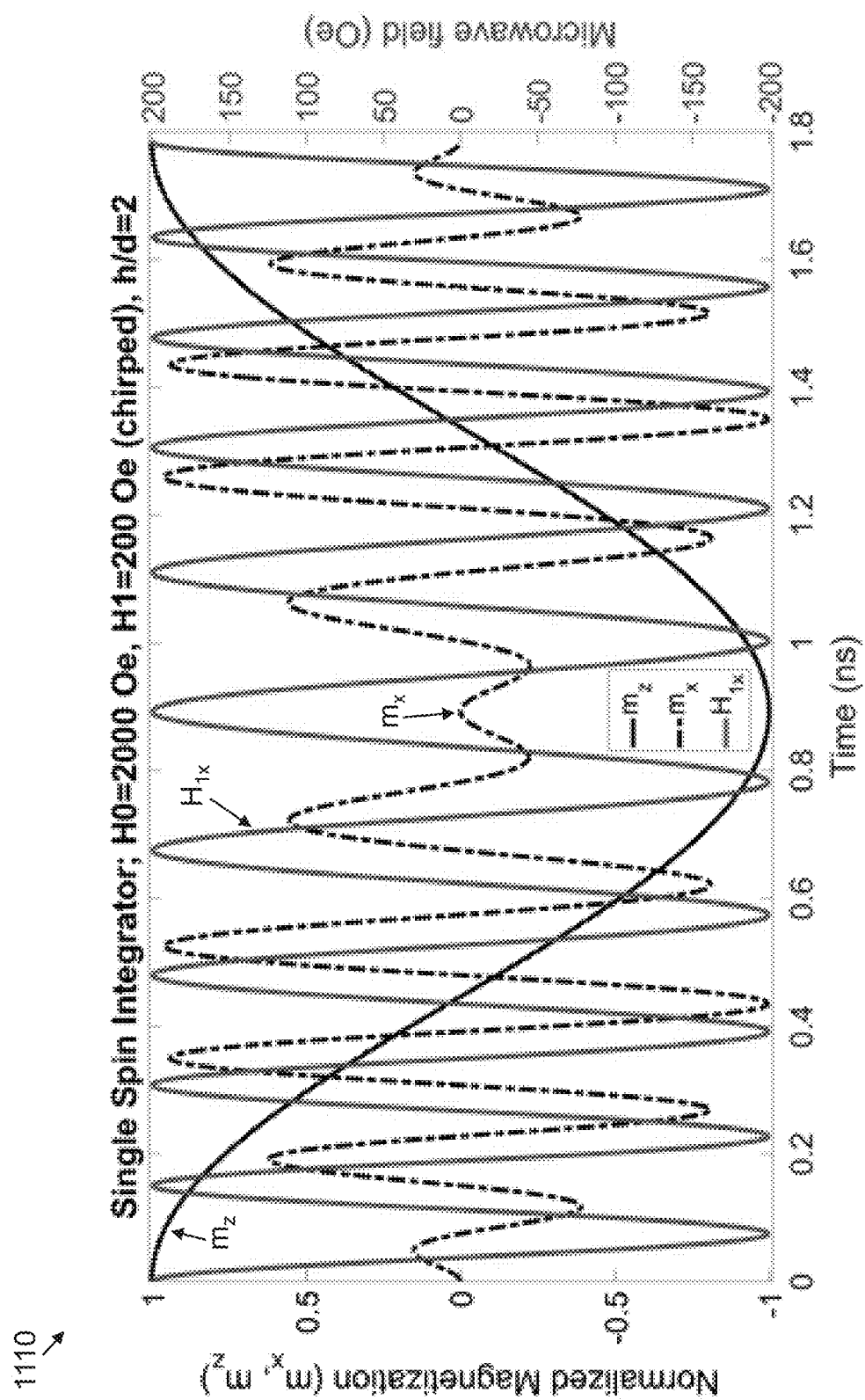
FIG. 11 illustrates an exemplary plot of normalized x and z components of the magnetization vs. time together with the applied r.f. field in a sample having aspect ratio h/d=2 during a single spin calculation with $H_0$=2000 Oe and $H_1$=200 Oe (chirped).
Figure 12:
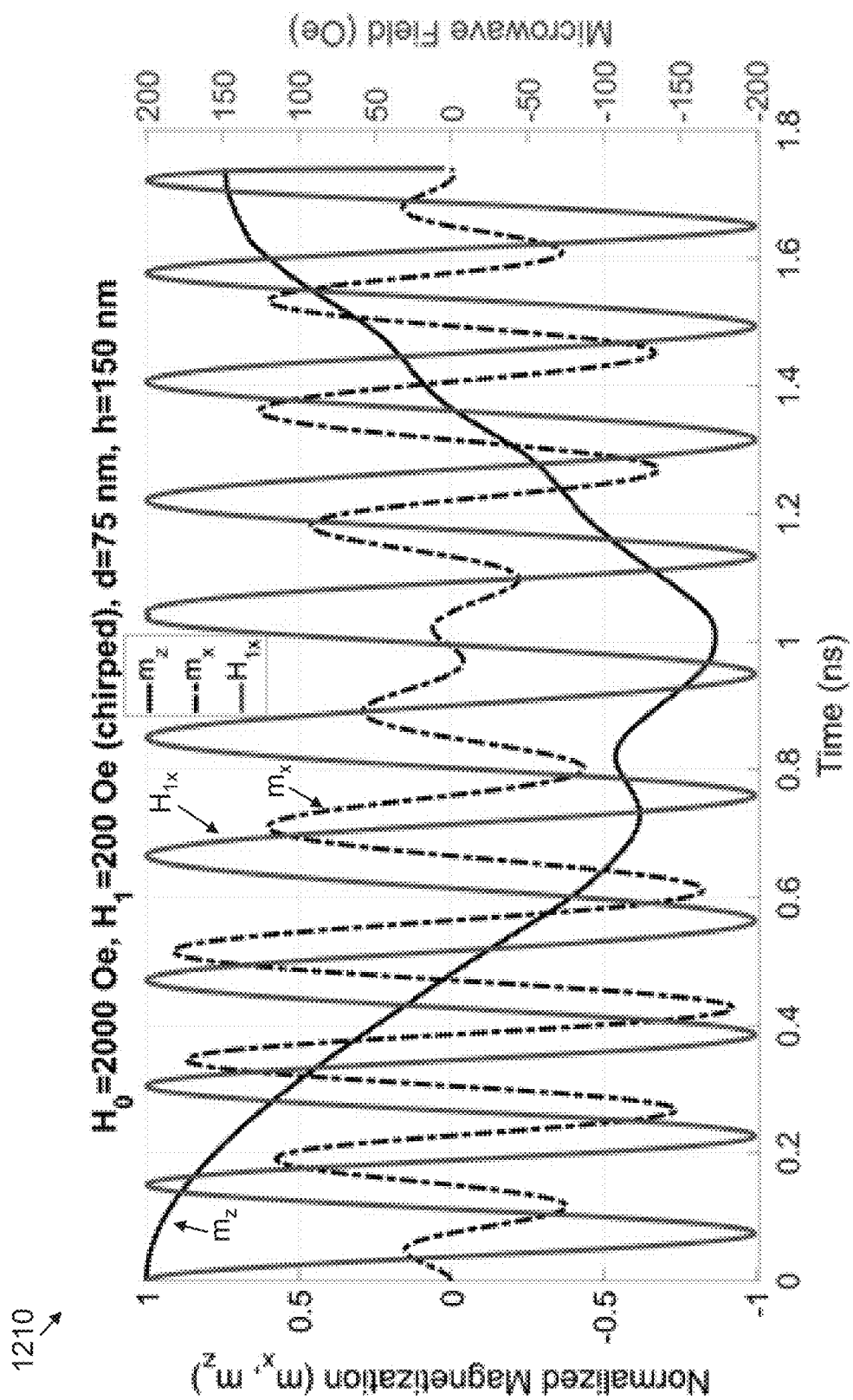
FIG. 12 illustrates an exemplary plot of normalized x and z components of the magnetization vs. time together with the applied r.f. field in a sample having aspect ratio h/d=2 during a chirped rotation simulation with $H_0$=2000 Oe and $H_1$=200 Oe (chirped), but with d=75 nm.

| FIG. Number | h(nm) | d(nm) | $H_0$(Oe) | $H_1$(Oe) | Chirp? | π or 2π rot. | Comments |
|---|---|---|---|---|---|---|---|
| 4 | 50 | 25 | 0 | 200 | yes | 2π | — |
| 6 | 50 | 25 | 0 | 200 | no | θ < π | Can rotate $m_z$ back to +1 |
| 7 | 50 | 25 | 0 | 10 | yes | π | Precession reversal at 90° |
| 8 | 50 | 25 | 2000 | 200 | yes | 2π | Compare FIGS. 11 & 12 |
| 9 | 100 | 25 | 0 | 200 | yes | 2π | — |
| 10 | 100 | 25 | 0 | 200 | no | θ < π | Can rotate $m_z$ to +1 |
| 11 | 2 × d | arbitrary | 2000 | 200 | yes | 2π | Single spin integrator |

TABLE I-continued

Exemplary simulation results

Figure 4:
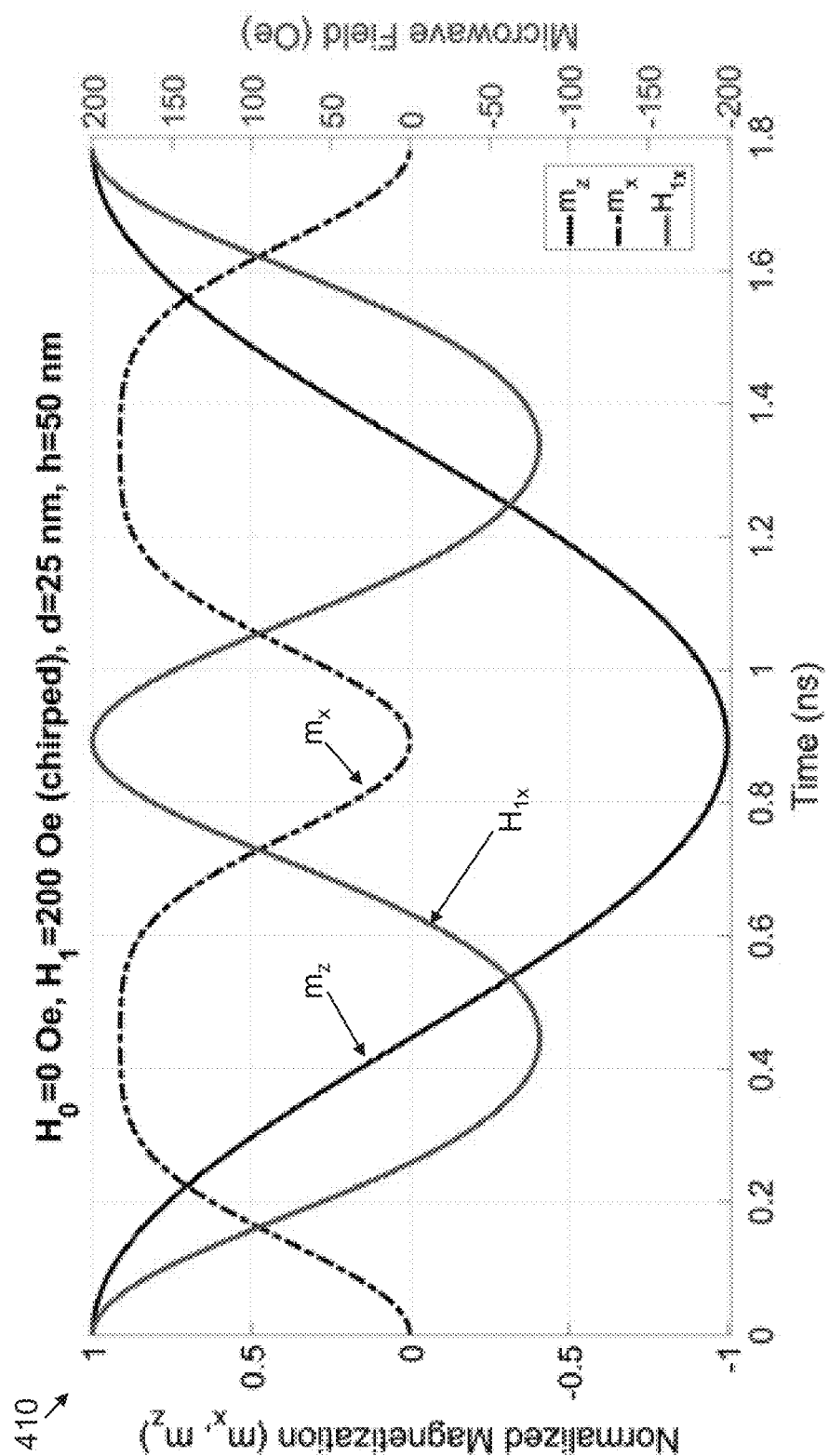
FIG. 4 illustrates an exemplary plot of normalized x and z components of the magnetization vs. time together with the applied r.f. field in a sample having h=50 nm and d=25 nm during a 360° rotation with H0=0 and H1=200 Oe (chirped).
Figure 9:
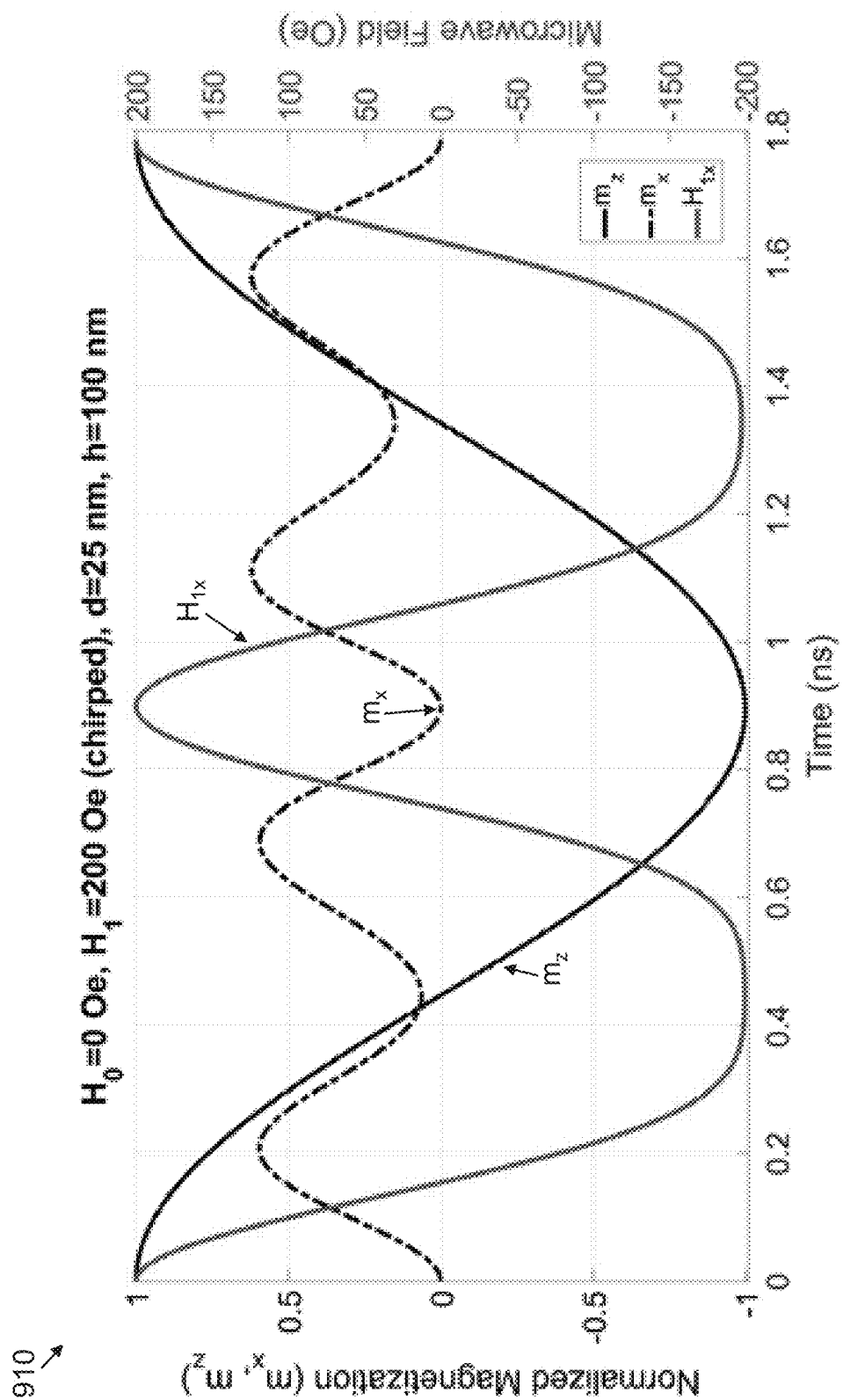
FIG. 9 illustrates an exemplary plot of normalized x and z components of the magnetization vs. time together with the applied r.f. field in a sample having h=100 nm and d=25 nm during a 360° rotation with $H_0$=0 and $H_1$=200 Oe (chirped).

| FIG. Number | h(nm) | d(nm) | $H_0$(Oe) | $H_1$(Oe) | Chirp? | π or 2π rot. | Comments |
|---|---|---|---|---|---|---|---|
| 12 | 150 | 75 | 2000 | 200 | yes | θ < π | Cannot rotate $m_z$ to +1 |
| 13 | 150 | 75 | 0 | 200 | yes | 2π | Compare with FIGS. 4 & 9 |

FIG. 4 illustrates an exemplary plot 410 of normalized x and z components of the magnetization vs. time together with the applied r.f. field in a sample having h=50 nm and d=25 nm during a 360° rotation with $H_0$=0 and $H_1$=200 Oe (chirped). Consider the case of zero external field [39]. This case is somewhat special, and potentially very important [40, 41], in that the precession direction reverses sign as the magnetization passes through 90°, since the component of the internal field along the cylinder axis then switches to the opposite direction.

FIG. 4 shows exemplary results for a full 360° rotation of the normalized magnetization (∫M(r,t)dV/($M_0$V)) in a sample at zero external field ($H_0$=0); e.g., under the influence of the external r.f. field together with the sample's self-generated demagnetization field. The exemplary sample of FIG. 4 has dimensions h=50 nm and d=25 nm for an aspect ratio h/d=2 and is subjected to a circularly polarized $H_1$ field of 200 Oe [42, 43]. The left-hand vertical axis of FIG. 4 shows the values of the plotted x and z components of the normalized magnetization $m_x$ and $m_z$, averaged over the sample. The right-hand vertical axis shows the x-component of the r.f. field $H_{1x}$. All quantities are plotted in FIG. 4 as a function of the time measured in nanoseconds from the initiation of the r.f. field.

Figure 5:
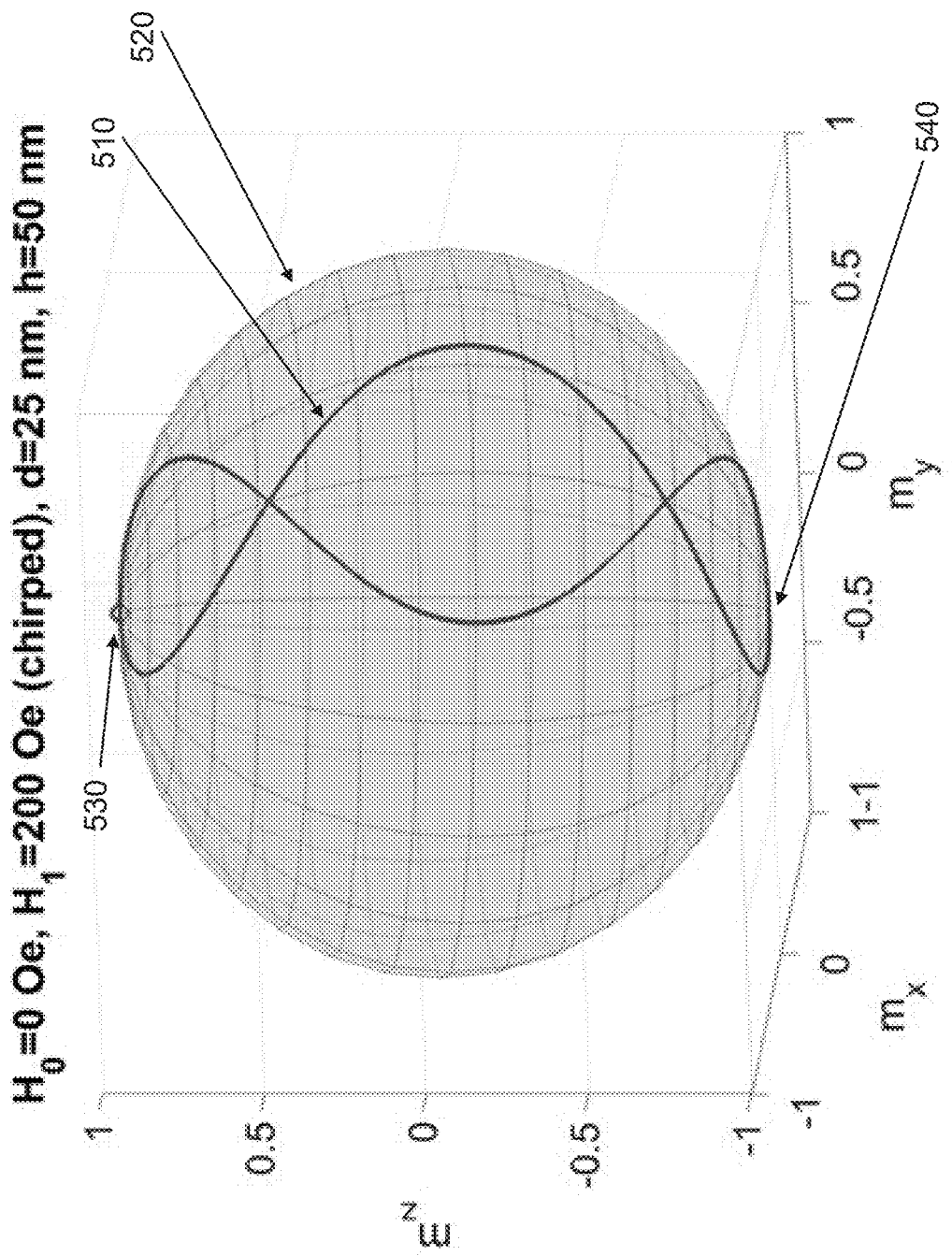
FIG. 5 illustrates an exemplary orbit associated with a zero static external field magnetization reversal under a chirped r.f. field plotted in perspective and in polar coordinates on the unit sphere.

FIG. 5 illustrates an exemplary orbit 510 associated with a zero static external field magnetization reversal under a chirped r.f. field plotted in perspective and in polar coordinates on the unit sphere 520. The process that produced the results illustrated in FIG. 4 also produced the results illustrated in FIG. 5. The magnetic field associated with the exemplary orbit 510 is $H_0$=0 Oe, $H_1$=200 Oe (chirped), with d=25 nm and h=50 nm. The orbit 510 plotted in FIG. 5 passes through both poles 530, 540 of the unit sphere 520 and intersects itself twice. At lower r.f. fields, where the magnetization executes multiple cycles in φ, additional intersections may be generated. The azimuthal starting angle is arbitrary.

Figure 6:
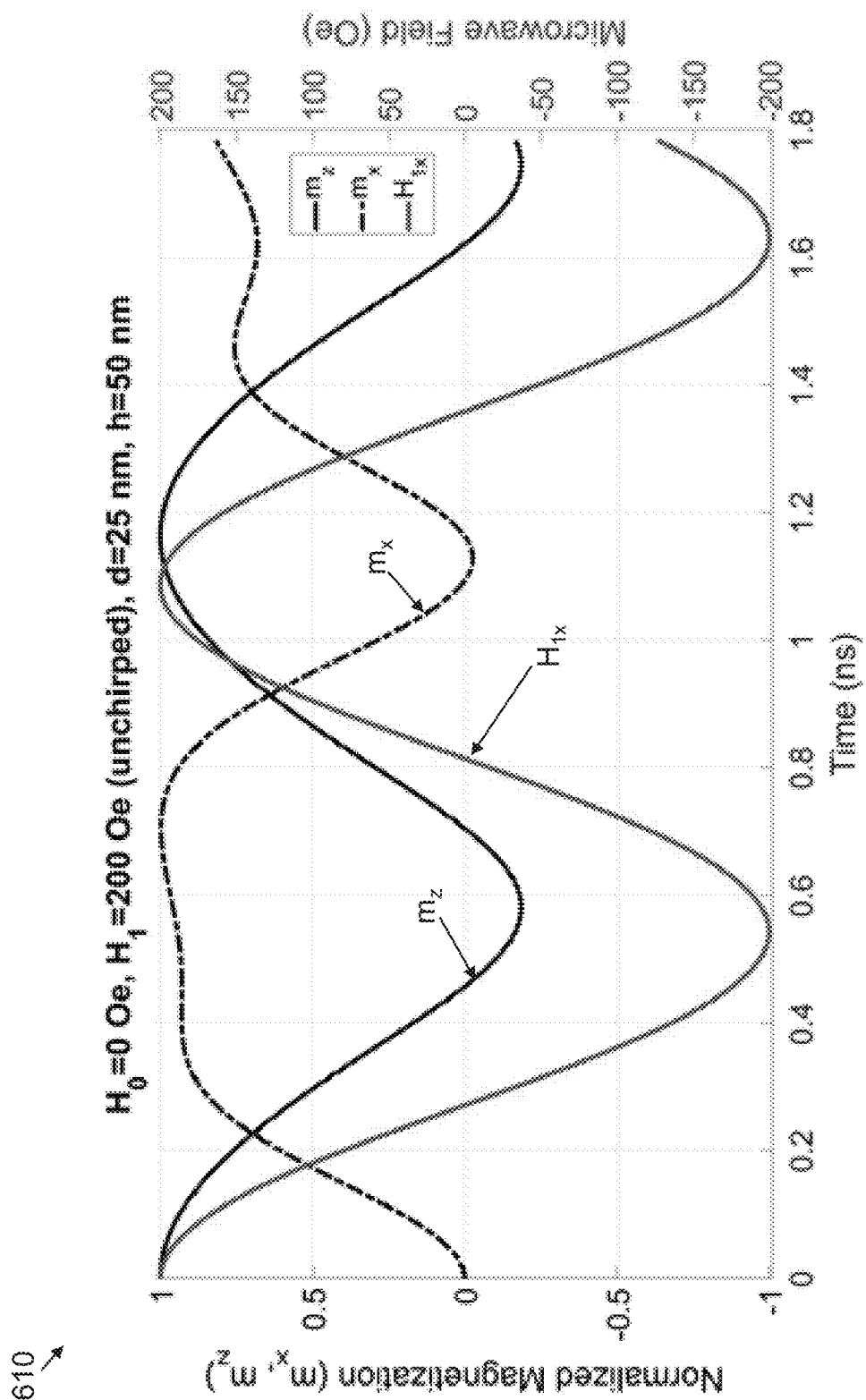
FIG. 6 illustrates an exemplary plot of normalized x and z components of the magnetization vs. time together with the applied r.f. field in a sample having h=50 nm and d=25 nm during a 360° rotation with $H_0$=0 and $H_1$=200 Oe (unchirped).

FIG. 6 illustrates an exemplary plot 610 of normalized x and z components of the magnetization vs. time together with the applied r.f. field in a sample having h=50 nm and d=25 nm during a 360° rotation with $H_0$=0 and $H_1$=200 Oe (unchirped). The quantities plotted in FIG. 6 are the same as those plotted in FIG. 4, except that, in contrast to FIG. 4, the r.f. field for the results plotted in FIG. 6 is not chirped but rather fixed at the small amplitude FMR value. As a result, there is no complete rotation associated with FIG. 6 and the values plotted in FIG. 6 differ from the values plotted in FIG. 4. If the magnetization can be rotated past 90°, and damping is present, $H_0$=0 reversal may still be accomplished simply by turning off the r.f. field and letting the magnetization relax toward $m_z$=−1. This kind of reversal may be referred to as a "dirty Pi pulse."

Figure 7:
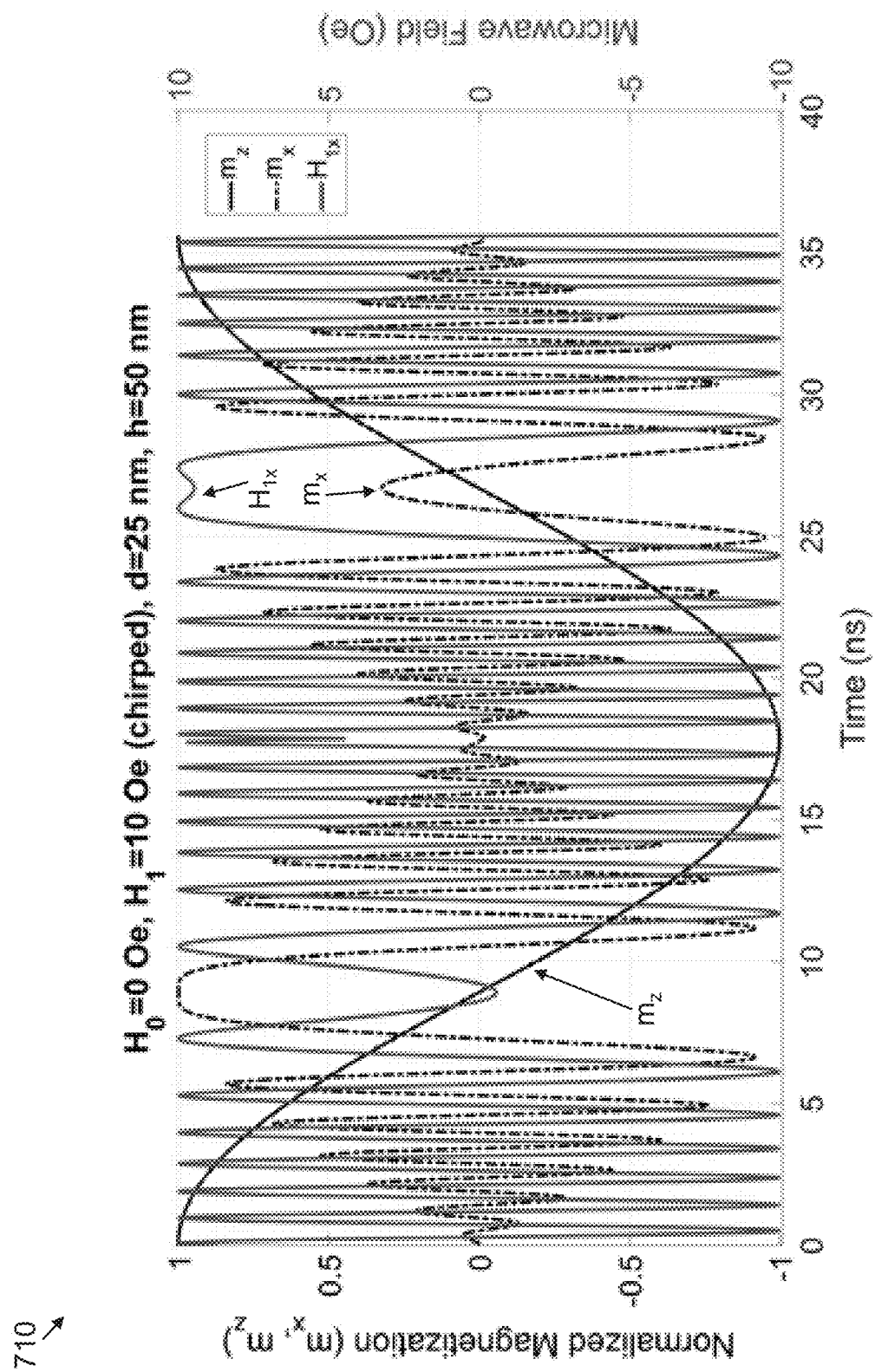
FIG. 7 illustrates an exemplary plot of normalized x and z components of the magnetization vs. time together with the applied r.f. field in a sample having h=50 nm and d=25 nm during a 180° rotation with $H_0$=0 and $H_1$=10 Oe (chirped).

FIG. 7 illustrates an exemplary plot 710 of normalized x and z components of the magnetization vs. time together with the applied r.f. field in a sample having h=50 nm and d=25 nm during a 180° rotation with $H_0$=0 and $H_1$=10 Oe (chirped). Compared to the example and results illustrated in FIG. 4, the example of FIG. 7 is for an $H_1$ field that is 20 times lower than in the example of FIG. 4. The $H_1$ field associated with FIG. 7 is more in line with current high amplitude FMR studies [44] than the $H_1$ field associated with FIG. 4. The switching associated with FIG. 7 may occur at a field level well below the internal demagnetization fields (and far below that used in magnetic recording). The example of FIG. 7 provides a more stringent test of the chirping algorithm in that the r.f. field rotates through a correspondingly larger phase angle (e.g., many more r.f. cycles) than the example of FIG. 4. Also note that as $m_z$ passes through 0 (e.g., θ=90°), the precession may again reverse (from clockwise to counter-clockwise with respect to +ẑ) because the quasi-static field in the system may be generated solely by dipole field in the sample, so that when $m_z$ passes through 0, the z-component of this quasi-static field also changes sign.

Figure 8:
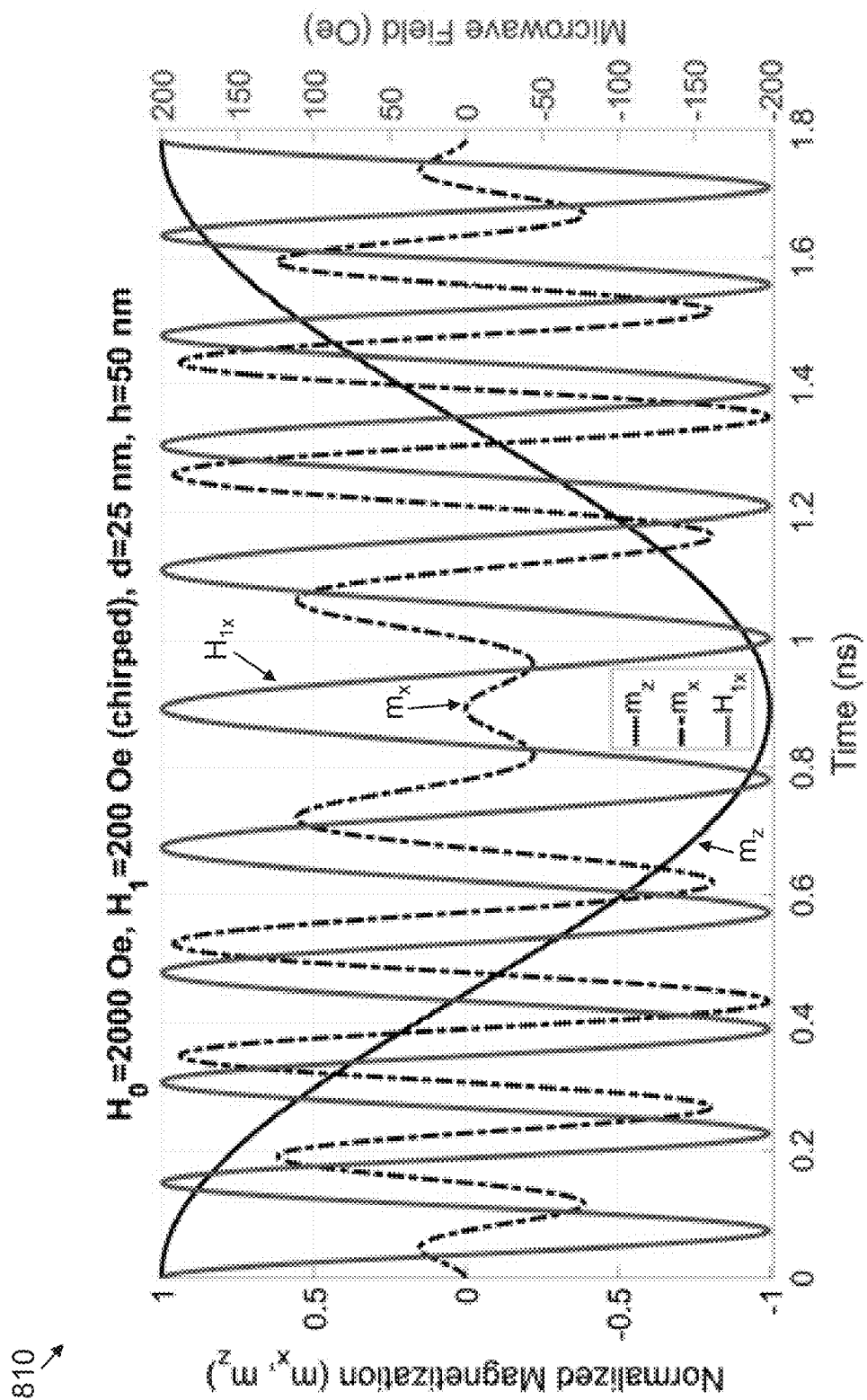
FIG. 8 illustrates an exemplary plot of normalized x and z components of the magnetization vs. time together with the applied r.f. field in a sample having h=50 nm and d=25 nm during a 360° rotation with H0=2000 Oe and H1=200 Oe (chirped).

FIG. 8 illustrates an exemplary plot 810 of normalized x and z components of the magnetization vs. time together with the applied r.f. field in a sample having h=50 nm and d=25 nm during a 360° rotation with H0=2000 Oe and H1=200 Oe (chirped). The example of FIG. 8 includes simulation results of the chirped magnetization evolution for a sample in the presence of an external d.c. magnetic field. Note the magnetization rotates perfectly through $m_z$=−1 and then returns to the starting point, $m_z$=+1. In this case where the external field exceeds the demagnetization fields, there may be no reversal of the precession. There may again be many precession periods during the process due to the large applied static field.

When $H_0$ and M are anti-parallel, the system may be in a meta-stable state. Up to some size-dependent maximum field, $H_0^{max}$, there may be a range of angles 180°>θ>$θ^{max}$(H) where the system is stable against small angle perturbations. Here switching may be performed by first applying the Pi pulse and then removing the static field. Unchirped dirty-Pi switching may still be possible in the presence of $H_0$ provided one can rotate past $θ^{max}$(H).

Figure 10:
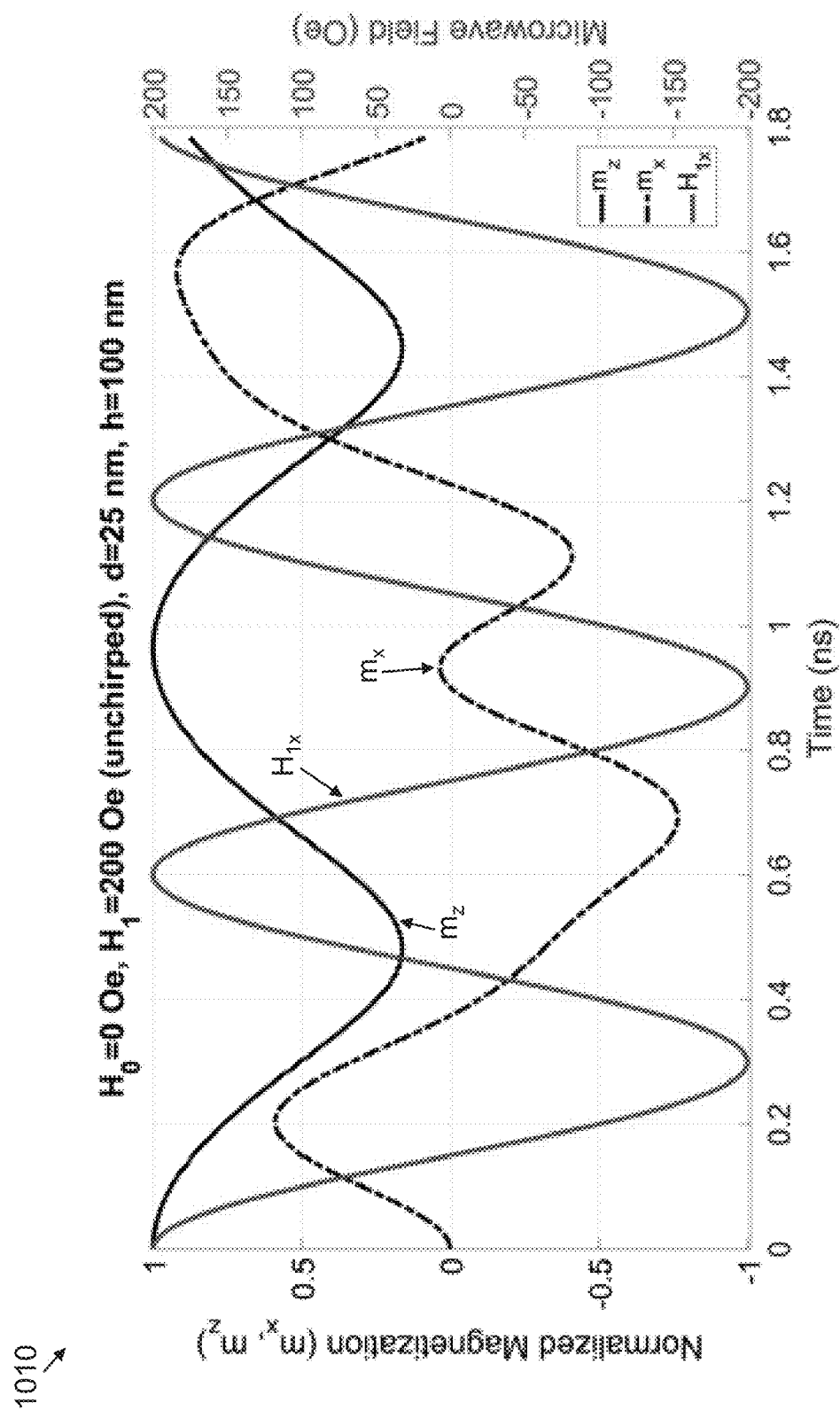
FIG. 10 illustrates an exemplary plot of normalized x and z components of the magnetization vs. time together with the applied r.f. field in a sample having h=100 nm and d=25 nm during a 360° rotation with $H_0$=0 and $H_1$=200 Oe (unchirped).

FIG. 9 illustrates an exemplary plot 910 of normalized x and z components of the magnetization vs. time together with the applied r.f. field in a sample having h=100 nm and d=25 nm during a 360° rotation with $H_0$=0 and $H_1$=200 Oe (chirped). FIG. 10 illustrates an exemplary plot 1010 of normalized x and z components of the magnetization vs. time together with the applied r.f. field in a sample having h=100 nm and d=25 nm during a 360° rotation with $H_0$=0 and $H_1$=200 Oe (unchirped). In contrast to the example of FIG. 4, the example of FIG. 9 is based on a sample having an aspect ratio of h/d=4, whereas the sample of FIG. 4 had an aspect ratio of h/d=2. In contrast to the example of FIG. 7, the example of FIG. 10 is without chirping and includes exciting at the small-angle free-precession frequency, yielding a nutating behavior. Here, the large-angle FMR precession frequency is even more angular dependent than in the example of FIG. 4, thereby enhancing the need for chirping. FIGS. 9 and 10 show the z and x components of the normalized magnetization along with the x-component of the $H_1$ field, which also has a magnitude of 200 Oe. The external field is zero in both cases. FIG. 9 shows the behavior for a chirped r.f. field and again shows near perfect rotations through 360°. On the other hand, FIG. 10 shows the unchirped case of excitation at the small-angle free precession frequency. Here it shows a two cycle nutating behavior, but now it is restricted to a much narrower angular range than that for the h/d=2 case for the same $H_1$ field; the maximum value of $m_z$ is only +0.2, which is well short of 90°. This would preclude using the dirty, damping-induced, switching approach discussed above for the h/d=2 case.

V. Modeling Large Angle Rotation of a Many-Spin System With a Single Spin

In this section we demonstrate that for smaller sized samples, the angle-dependent (driven) response may be modeled by numerically integrating the Landau-Lifshitz equation as if the system behaves as a single giant macrospin. Here the internal demagnetization fields may be represented via a demagnetization tensor [45]. This may be referred to as single spin dynamics (SSD). This integration may also be carried out analytically as shown in Appendix A for the uniaxially symmetric case considered here. Both approaches may be implemented with or without the damping. Here the internal fields created by the spin ensemble as a whole may be represented by a demagnetization tensor with constant elements that may be obtained either by fitting the many-spin simulations, as demonstrated below, or from other considerations [46, 47]. The chirping algorithm may be essentially identical to that used in the OOMMF simulations.

FIG. 11 illustrates an exemplary plot 1110 of normalized x and z components of the magnetization vs. time together with the applied r.f. field in a sample having aspect ratio h/d=2 during a single spin calculation with $H_0$=2000 Oe and $H_1$=200 Oe (chirped). The magnetization may be generated by direct integration of the Landau-Lifshitz equation for a single spin, with a demagnetization tensor corresponding to a sample with h=50 nm and d=25 nm. The demagnetization tensor elements for the calculation were obtained from cited work of Sato and Ishi for the same fields and h/d ratio and resulted in the following diagonal elements: (0.4091, 0.4091, 0.1819). If the single spin results of FIG. 11 are compared with the OOMMF results shown above in FIG. 8, we see that they are in near-perfect agreement. Recall that the magnetization is initially relaxed in the exemplary OOMMF simulations discussed herein. In the present case of FIG. 11, initial relaxation of the magnetization results in $M_z(t=0)/M_0=0.999956$. Hence the initial state of the exemplary d=25 nm sample is near-perfectly aligned. Thus, exchange may be playing the dominant role here.

As an overall check on both procedures, the analytic results obtained in the Appendix have been compared with our direct numerical integrations of the LLG equations. The agreement is excellent.

VI. Instability Issues

FIG. 12 illustrates an exemplary plot 1210 of normalized x and z components of the magnetization vs. time together with the applied r.f. field in a sample having aspect ratio h/d=2 during a chirped rotation simulation with $H_0$=2000 Oe and $H_1$=200 Oe (chirped), but with d=75 nm. The sample used in the example of FIG. 12 is three times larger than sample used in the prior examples discussed above. The static field of $H_0$=2000 Oe is along the z axis. As always, the magnetization was initially relaxed along the z-axis. The ability to perform perfect Pi pulses as demonstrated above may break down for larger samples and higher fields, as the example of FIG. 12 illustrates. When the r.f. is applied, the net magnetization may rotate, as before, but now go through a local minimum at $m_z$=−0.62 after which the magnetization may briefly reverse before proceeding on to a global minimum of $m_z$~−0.87. The magnetization may then rotate back, but only to a value $m_z$=+0.74. Note that the magnetization does not reach 180°, nor does it return to 0°. These behaviors may arise because the magnetization evolves into an inhomogeneous state as it rotates (e.g., as a projection of the magnetization distribution confirms) where the rotation algorithm, which is based on the average magnetization, may no longer be fully effective.

Figure 13:
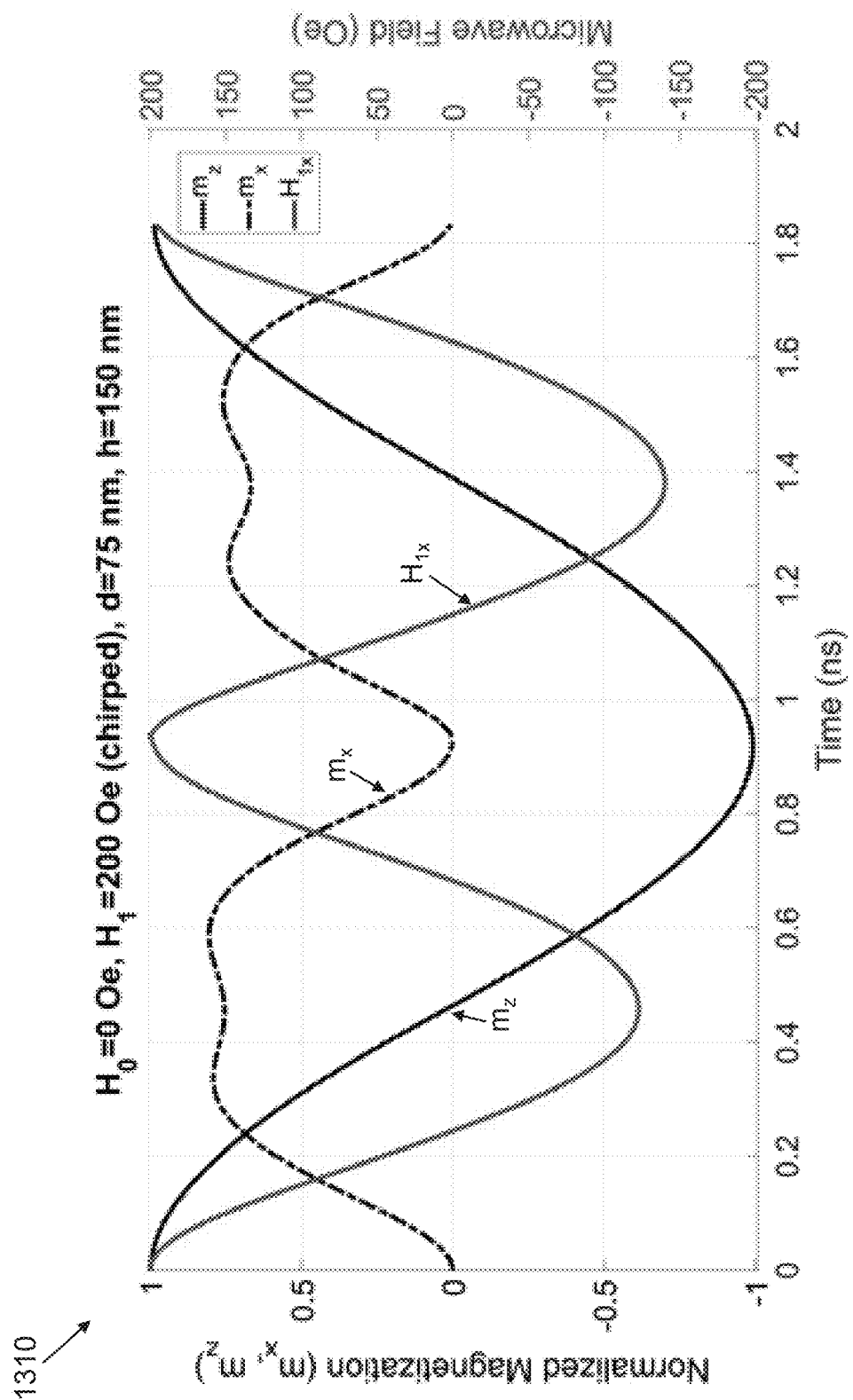
FIG. 13 illustrates an exemplary plot of normalized x and z components of the magnetization vs. time together with the applied r.f. field in a sample having aspect ratio h/d=2 during a chirped rotation simulation with $H_0$=0 and $H_1$=200 Oe (chirped), but with d=75 nm.

FIG. 13 illustrates an exemplary plot 1310 of normalized x and z components of the magnetization vs. time together with the applied r.f. field in a sample having aspect ratio h/d=2 during a chirped rotation simulation with $H_0$=0 and $H_1$=200 Oe (chirped), but with d=75 nm. Note that in this example, in contrast to the example of FIG. 12, the magnetization may be continuously rotated through 2Pi. Thus, 360° magnetization rotations may be performed in the sample for which results are illustrated in FIG. 13. These differing behaviors may be related to the larger number of precession periods at high fields and/or the positioning of a high amplitude Walker mode relative to the r.f. frequency. Some corrective action may be taken in an effort to suppress or compensate for it.

Given recent progress in preparing controlled magnetic nanostructures, both individually and in arrays (e.g., to increase signal amplitudes), the field of large-amplitude dynamic responses in ferromagnets may be positioned to enter a new fruitful era. Simulation may remain a primary tool to describe such responses, since the responses may lie beyond the range of what may be studied via perturbation theory. Studies may be performed of situations in which multiple high amplitude pulses, at the same or different frequencies and times, are applied to exemplary samples.

In the above discussion, potential practical applications to magnetic recording have been mentioned. Note that the simulations discussed above were limited to a non-conducting medium. Recording media generally involve conducting materials where the presence of additional degrees of freedom results in additional complexity [48, 49].

VII. Introduction of Second Methodology

In this and the following sections, a second methodology for efficiently performing microwave assisted switching of small ferromagnetic samples (e.g., nanomagnets) is discussed. Magnetization reversals in cylindrical YIG nanomagnets may be simulated by applying a fixed-frequency transverse microwave field and a time-varying longitudinal applied field along the direction of the static field so as to continually match the precession frequency with the microwave frequency. The ideal form of such a microwave field may be circularly polarized. Linearly polarized microwave fields may also be used since they are simpler to implement. Inhomogeneous modes may nucleate in larger samples with dimensions several times larger than an exchange length, which may lead to incomplete switching.

As noted above in a prior section, magnetization reversals in magnetic recording media have been largely carried out by brute force, for example, by a field applied opposite to the existing magnetization direction of some bit that has sufficient magnitude to produce an oppositely-magnetized bit. The fields used have often been quite large, for example, ~10 kG, requiring elaborate magnetic circuitry to keep the fields localized so they do not spill over onto neighboring bits. This situation may be contrasted with the resonant magnetization reversals performed in Nuclear Magnetic Resonance (NMR) spin echo experiments in which r.f. fields of a few Gauss coherently reverse the magnetization in the presence of static fields of a few kG, for example, by applying a so-called Pi pulse.

Rotating the magnetization in a similar way in ferromagnetic samples has generally not been possible (at least in larger samples) for two reasons: 1) some sort of anisotropy is generally present, the axis of which defines the equilibrium direction, causing the large-angle precession frequency to be angle dependent, and 2) the magnetization may evolve into an inhomogeneous state at large tipping angles due to the excitation of internal Walker [11, 12] or Walker-exchange modes [55] via the so-called Suhl instabilities [8, 9]. Avoiding the first effect may be achieved by sweeping the frequency of the applied r.f. pulse, referred to as chirping, which is discussed above, or keeping the microwave frequency constant while sweeping the magnitude of an applied longitudinal field, which is discussed in this and the following sections. The second effect may be suppressed by restricting the sample size so that the exchange interaction keeps the spins in the sample aligned as the magnetization rotates.

VIII. Micromagnetic Simulation Configuration of Second Methodology

Simulations disclosed herein were performed using the OOMMF (Object Oriented MicroMagnetic Framework) developed at NIST [33, 56]. OOMMF assigns a grid to the sample, each cell of which may carry a magnetic moment which follows from the saturation magnetization and the cell volume. Interactions between cells may include the dipolar fields arising from the remaining cells together with the crystalline anisotropy and nearest-neighbor exchange contributions. Custom-made interactions may also be incorporated, for example, the Dzyaloshinsky-Moriya interaction [57]. In the results presented herein, the long-range dipolar interaction and nearest neighbor exchange interactions have been included.

The time evolution of the magnetic moment of each cell may follow from the Landau-Lifshitz equation [34, 58], that for i-th cell is given by $$\dot{M}_i = -\gamma M_i \times H_i - \frac{\alpha\gamma}{M_0} M_i \times (M_i \times H_i) \qquad (2)$$

where $M_i$ is the magnetization of the given cell, $\gamma$ is the gyromagnetic ratio ($\gamma>0$), $H_i$ is the total field at i-th cell, $\alpha$ is a dimensionless damping constant, and $M_0$ is the magnitude of the magnetization. Fully relaxed magnetization configurations were used as the initial state prior to a switching simulation. We used typical parameters for YIG [38]: $M_0=1.39\times10^5$ A/m (corresponding to $4\pi M_0=1750$ Oe), $\gamma=2.213\times10^5$ rad*Hz/(A/m) (corresponding to 2.80 MHz/Oe), $\alpha=5\times10^{-5}$, and exchange stiffness constant A=3.5*$10^{-12}$ J/m which is used to obtain the effective field due to exchange interaction [59]. The detailed physical formulation can be found in Miltat and Donahue [60].

Figure 14:
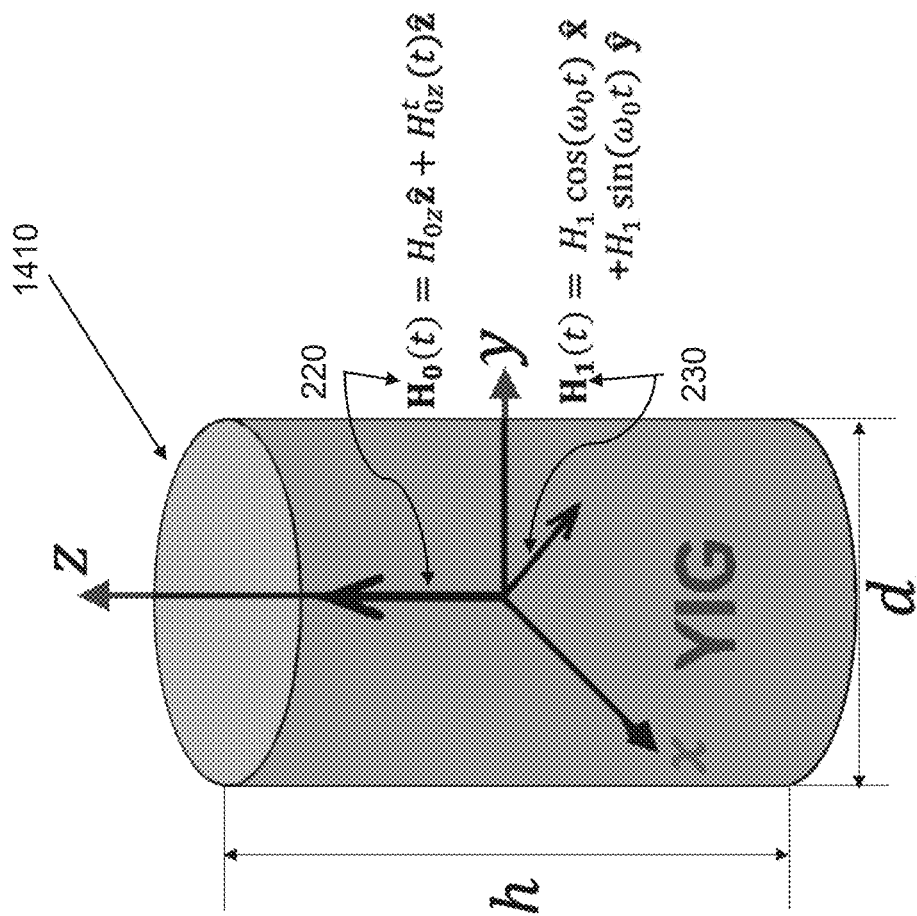
FIG. 14 illustrates an exemplary sample geometry of a YIG sample together with applied fields used in exemplary OOMMF simulations.

FIG. 14 illustrates an exemplary YIG sample 1410 having a cylindrical shape with diameter d and height h. The YIG sample 1410 may be a cylinder having h>d. The x-y plane may correspond to a circular cross section of the cylinder and the z-axis is parallel to the cylinder axis. Since h is at least two times larger than d, the cylinder axis may be an easy axis so that the equilibrium state has its magnetization along the ±z direction. The field 220 applied along the z-axis may include both a static component and a time-varying component, and may be represented as $H_0(t)=H_{0z}\hat{z}+H_{r0z}(t)\hat{z}$.

The field 230 applied in the x-y plane may be represented as $H_1(t)=H_1\cos(\omega 0 t)\hat{x}+H_1\sin(\omega 0 t)\hat{y}$. The field 230 applied in the x-y plane may be a circularly polarized microwave field for which the small amplitude uniform FMR frequency may be approximated as $$\omega_0=\gamma(H_{0z}+4\pi(K_2-K_1)M_0) \qquad (3)$$

where $H_{0z}$ is a static applied field along the z-axis and $K_1$ and $K_2$ are the effective magnetometric demagnetization coefficients along the z-axis and transverse x or y directions respectively (e.g., obtained by treating the entire body as uniformly magnetized) [46, 47, 50]. This may be a valid assumption when the size of the sample is less than or comparable to its magnetostatic exchange length [61]

$$l_{ex} = \sqrt{\frac{2A}{\mu_0 M_0^2}} = \sqrt{\frac{2A}{4\pi M_0^2}}. \qquad (4)$$

For the case where h=2d, $K_1=0.182$ and $K_2=0.409$; when h=4d we have $K_1=0.098$ and $K_2=0.451$ [46, 47].

If one assumes that the sample is uniformly magnetized along z direction, when a transverse microwave field $H_1(t)$ is applied, the transverse component of magnetization, $M_\perp=M_x+M_y$, may become non-zero and may be positioned 90° away from $H_1(t)$. To maximize the efficiency of a magnetization reversal, the transverse magnetization $M_\perp$ may remain perpendicular to $H_1(t)$.

In a non-spherical sample, the precession frequency of the (largely) uniform mode may depend on the polar angle $\theta$ (defined by $M_0 \cos\theta=m_z$) as well as the magnitude of applied field; e.g., $\omega=\omega(\theta, H_{0z})$. Solving the equation $\omega_0=\omega(\theta(t), H_{0z}(t))$, where $\omega_0$ is the applied frequency, yields the form for $H_0(t)$ $$H_0(t) = [H_{0z} + H_{0z}^t(t)]\hat{z} = [H_{0z} + 4\pi(K_2 - K_1)M_0(1-\cos(\gamma H_1 t))]\hat{z} \qquad (5)$$

(This may be easily derived, as discussed in Appendix A herein). When this condition is satisfied, the rotation rate $\dot{\theta}(t)$ may be constant (e.g., $\dot{\theta}(t)=\gamma H_1$), and therefore a full $\pi$ rotation may take a time $$t_\pi = \frac{\pi}{\gamma H_1}, \qquad (6)$$

which is the same as that for a $\pi$ pulse in NMR [62].

Figure 15:
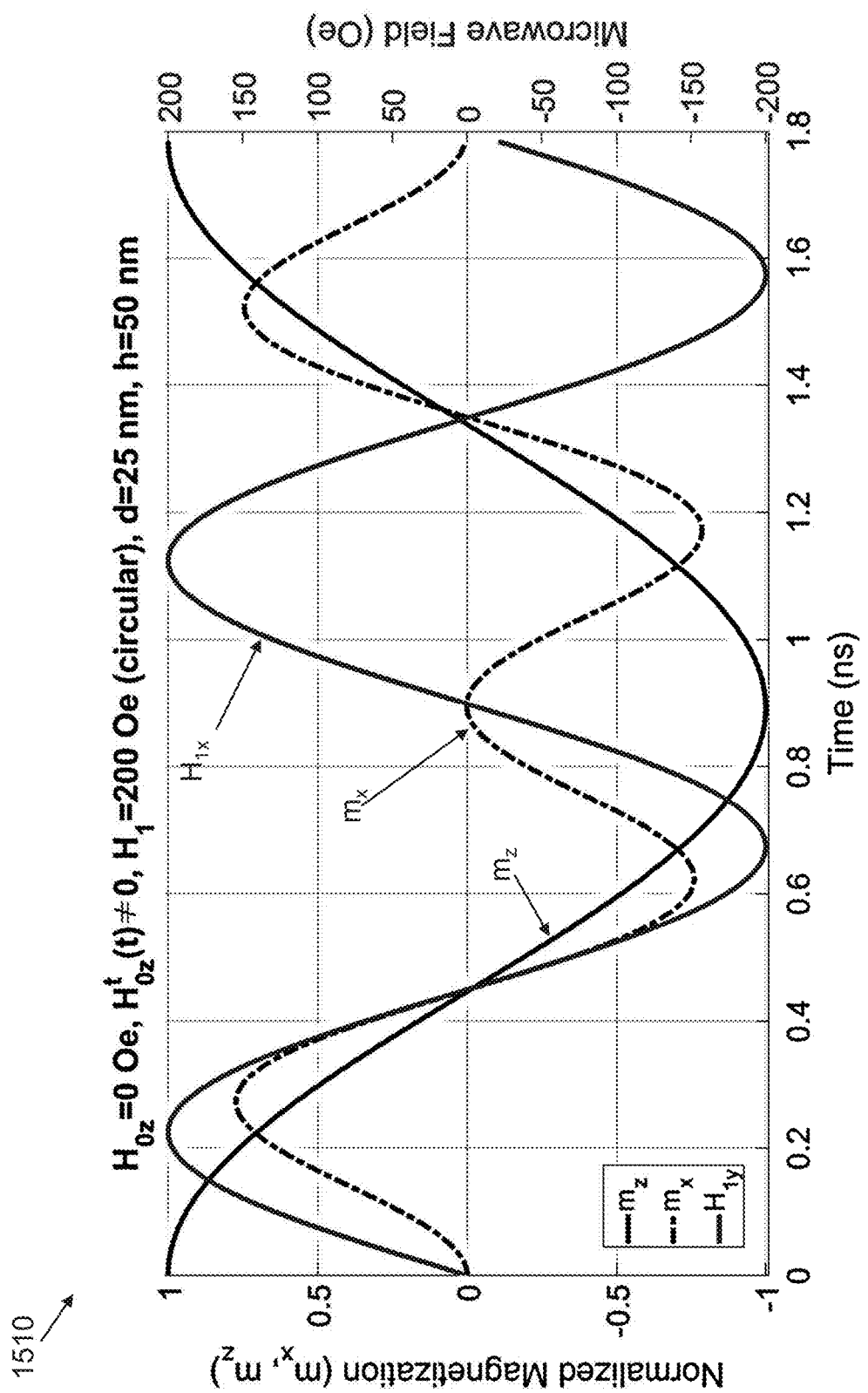
FIG. 15 illustrates an exemplary plot of results from an exemplary magnetic rotation.

IX. Micromagnetic Simulations of Large Angle Magnetization Rotations With a Circularly Polarized Microwave Field FIG. 15 illustrates an exemplary plot 1510 of results from an exemplary magnetic rotation. The exemplary plot 1510 was created via a simulation with stationary field $H_{0z}=0$ Oe, $H_{0z}^t(t)\neq 0$ in which the precession frequency is matched with $\omega_0$, e.g., $\omega_0=\omega(\theta(t), H_{0z}(t))$; here $H_1=200$ Oe, which is a typical field strength used in other microwave assisted switching (MAS) studies [21, 22, 24, 39], and the sample dimensions are d=25 nm and h=50 nm, which are both comparable to a magneto-static exchange length of the YIG sample, $l_{ex}=16.98$ nm. Here t$\pi$=0.893 ns, which follows from (5). Note that $m_z$ starts from a value of 1, passed through a value of −1, and then returns to a value of 1, corresponding to a full 360° rotation. The simulation shows that the system uniformly and completely reverses under $H_{0z}(t)$ and a circularly polarized transverse microwave field. The profile of $H_{0z}(t)$ is given below in FIG. 19.

Figure 16:
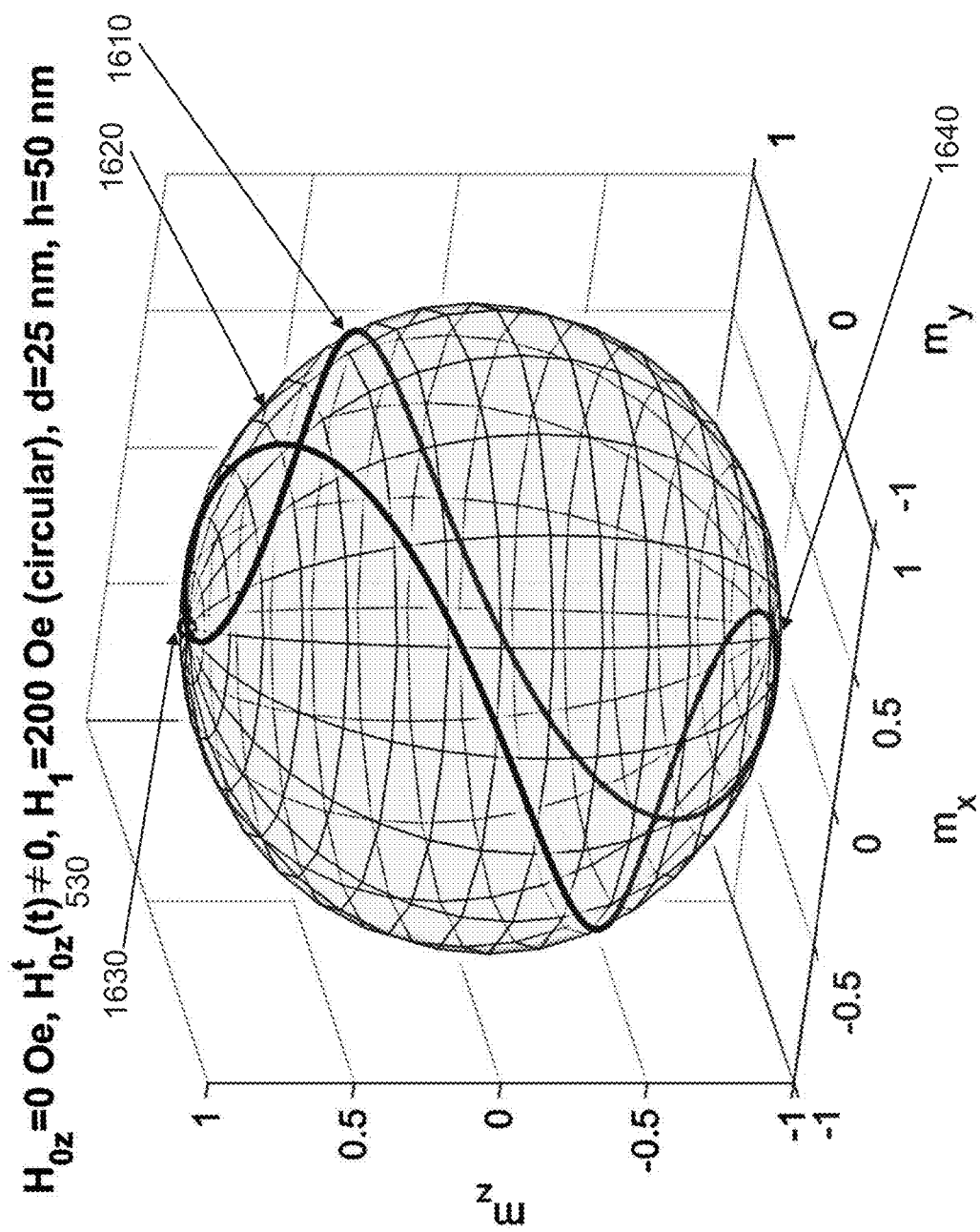
FIG. 16 shows an exemplary vector path 1610 of the magnetization (e.g., the orbit) plotted on the unit sphere 1620 having poles 1630, 1640, corresponding to the simulation results of FIG. 15.

FIG. 16 shows an exemplary vector path 1610 of the magnetization (e.g., the orbit) plotted on the unit sphere 1620 having poles 1630, 1640, corresponding to the simulation results of FIG. 15. One may clearly visualize how the magnetization reversal proceeds on the unit sphere 1620. Here $4\pi(K_1-K_2)M_0=397$ Oe≈$2H_1=400$ Oe; with these parameters one rotation period ($\Delta\theta=360°$) involves approximately two precession periods ($\Delta\phi=720°$).

Figure 17:
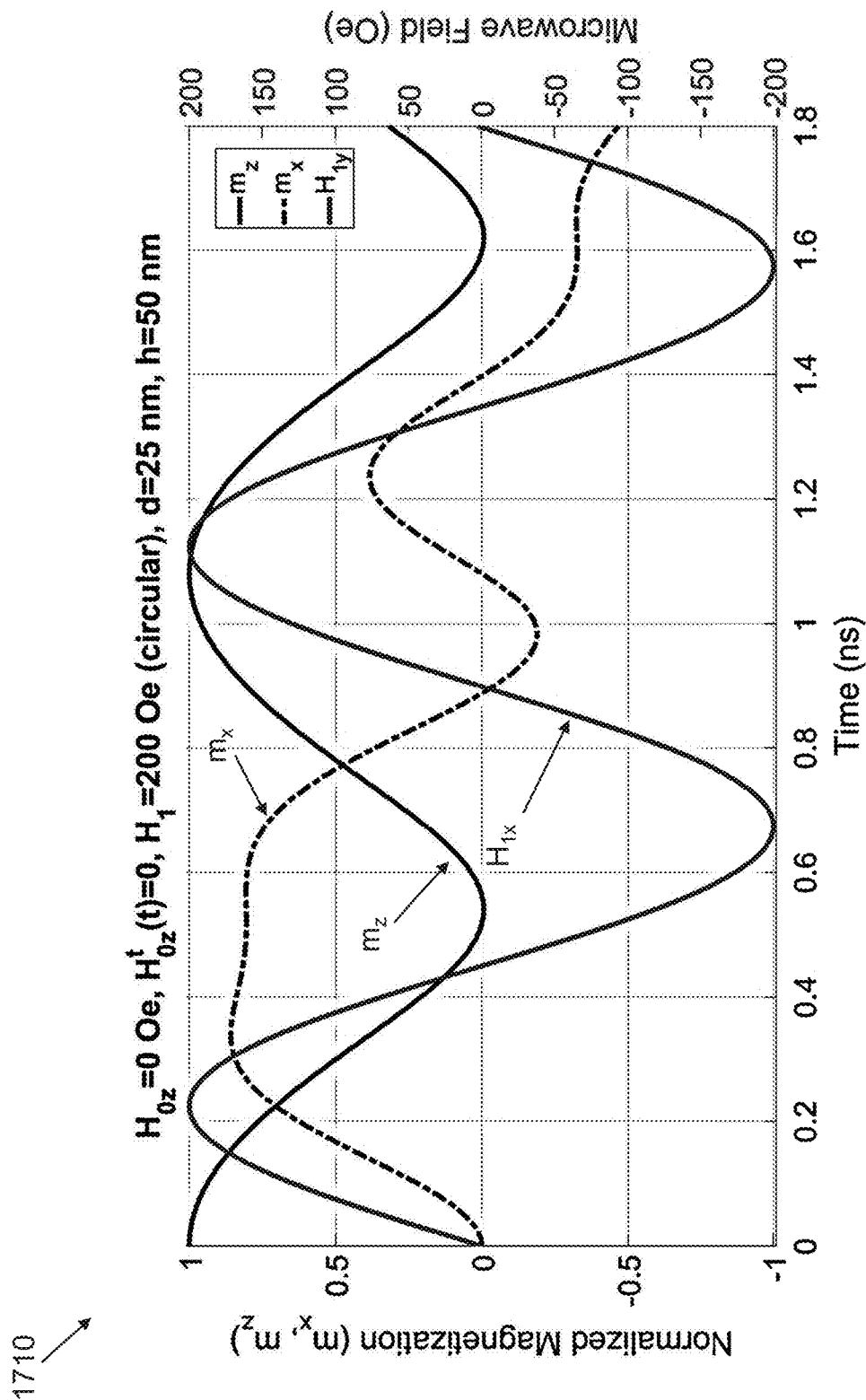
FIG. 17 illustrates an exemplary plot of results from an exemplary magnetic rotation.

FIG. 17 shows an exemplary plot 1710 of results from an exemplary magnetic rotation from a simulation identical to that in FIG. 15 except for using $H_{0z}{}^t(t)=0$ to demonstrate the effectiveness of the switching strategy discussed in this section of the present disclosure. As shown in FIG. 17 in contrast to FIG. 15, the normalized $m_z$ hits 0 and then comes back to 1; e.g., the maximum rotation angle is 90°. The magnetization is not switched in this example, but rather shows nutating motions with an amplitude of $\Delta\theta\cong90°$.

Figure 18:
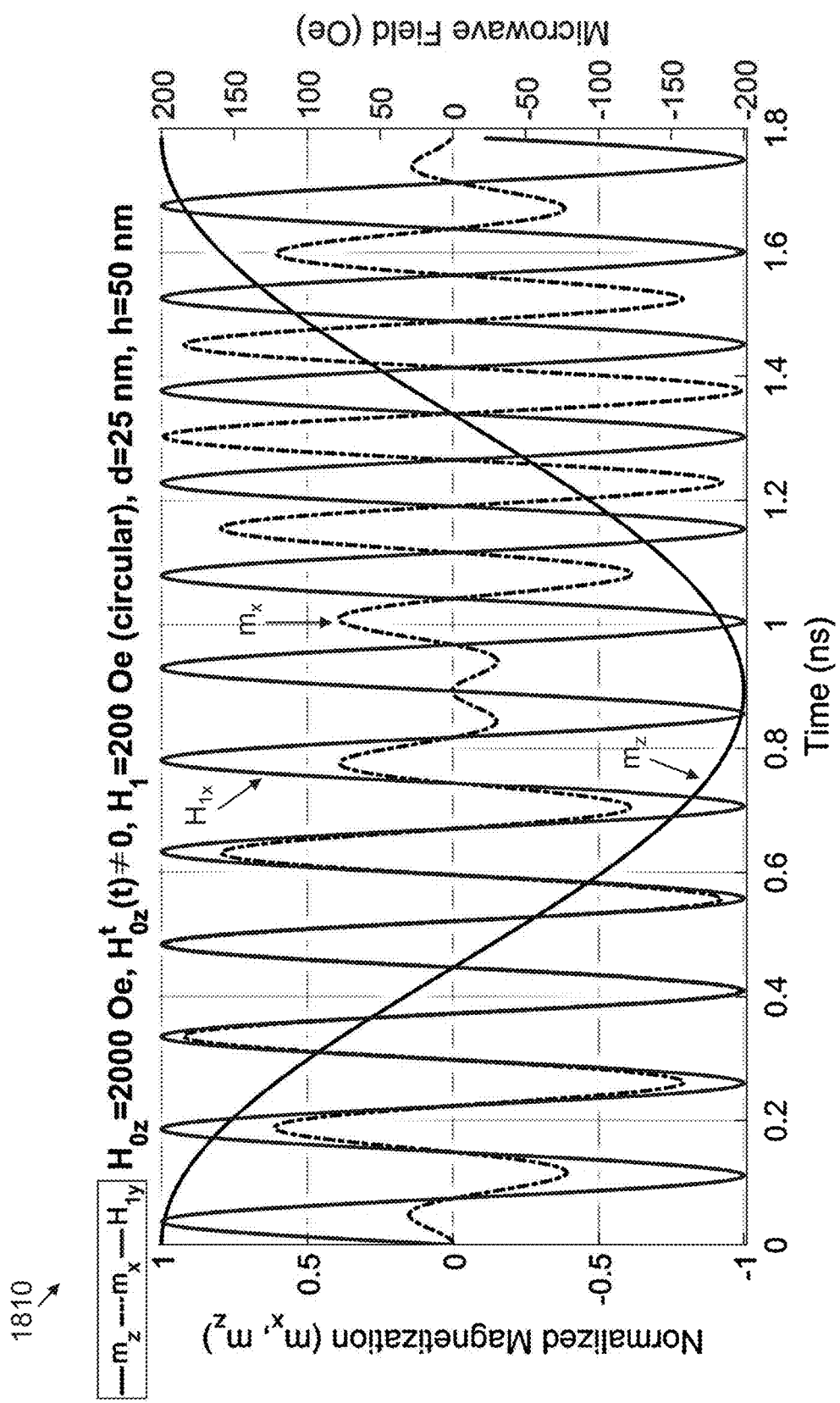
FIG. 18 illustrates an exemplary plot of results from an exemplary magnetic rotation.

FIG. 18 illustrates an exemplary plot 1810 of results from an exemplary magnetic rotation from a simulation where a static field $H_{0z}$ of 2000 Oe is present corresponding to a significantly higher $\omega_0$ with the same θ rotation rate, as fixed by $H_1$. Therefore, many precession periods may occur within one magnetization reversal. The results show that $m_x$ and $H_{1y}$ are in-phase in the interval $0<\theta<180°$, but $m_x$ and $H_{1y}$ are 180 degrees out-of-phase for $180°<\theta<360°$. This may typically be the case when nuclear magnetic moments are refocused under a π pulse to generate spin echoes [62].

Figure 19:
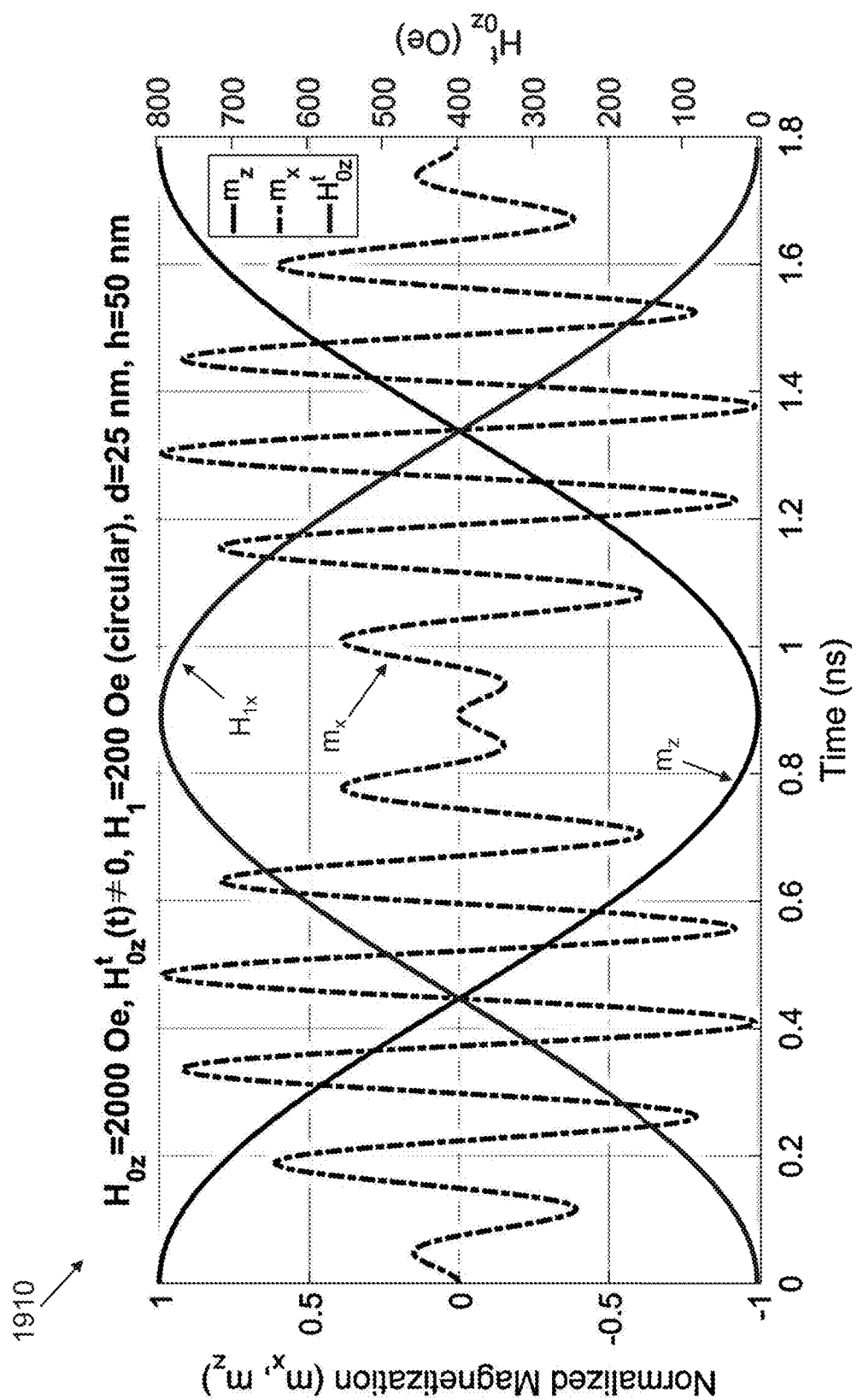
FIG. 19 illustrates an exemplary plot of results from an exemplary magnetic rotation.

FIG. 19 illustrates an exemplary plot 1910 of results from an exemplary magnetic rotation from a simulation identical to that in FIG. 18 except that the right y-axis shows the time varying part of the z-directed field $$H_{0z}^t(t) = 4\pi(K_2-K_1)M_0(1-\cos(\gamma H_1 t)). \quad (7)$$

Here $H_{0z}{}^t(t)$ starts from 0 and rises to $H_{0z}{}^t(t=t_\pi)=8\pi(K_2-K_1)M_0$ at $t=t\pi=\pi/(\gamma H_1)$ where $m_z=-1$. Note that (6) does not depend on the static field, $H_{0z}$, so that $H_{0z}{}^t(t)$ shown in FIG. 19 is the same as in the simulation of FIGS. 15 and 17.

Figure 20:
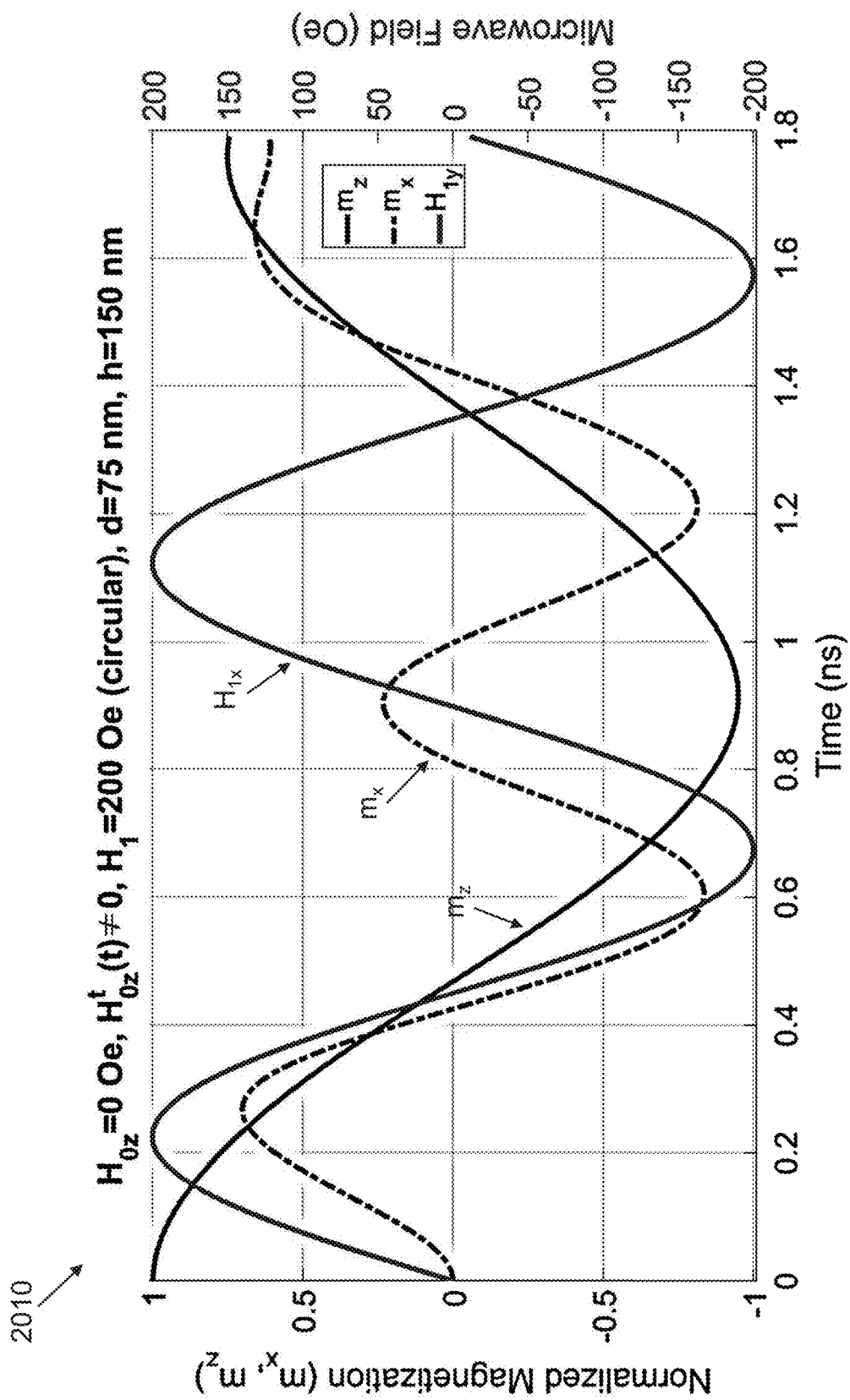
FIG. 20 illustrates an exemplary plot of results from an exemplary magnetic rotation.

FIG. 20 illustrates an exemplary plot 2010 of results from an exemplary simulation for a larger sample with d=75 nm and h=150 nm, with other parameters being the same as those used for FIG. 15. Note the normalized $m_z$ does not hit −1, but only reaches −0.95. Also, on examining the magnetization texture cell by cell, we find that the magnetization texture becomes non-uniform during the process. At some instant, a nonuniformity within the magnetization distribution is nucleated, a process akin to the Suhl instabilities [8, 24]. In the simulations, samples bigger than this size showed severely degraded reversal qualities and ultimately became non-rotatable.

X. Micromagnetic Simulations With a Linearly Polarized Microwave Field

In this section, magnetization reversals are demonstrated with linearly polarized microwaves, which may be much easier to achieve in practice compared to a circularly polarized field. For the case of a linearly polarized field, $H_0(t)$ becomes $$H_0(t) = [H_{0z} + H_{0z}^t(t)]\hat{z} = [H_{0z} + 4\pi(K_2-K_1)M_0(1-\cos(\gamma H_1 t/2))]\hat{z} \quad (8)$$

Note that (7) does not guarantee a 90° relation between microwave field and the in-plane magnetization. Also, the rotation rate OW may no longer be strictly constant (as discussed below). The time for a 180° rotation then becomes $$t_\pi = \frac{2\pi}{\gamma H_1} \quad (9)$$

where $H_1$ is the redefined amplitude of the linearly polarized microwave field.

Figure 21:
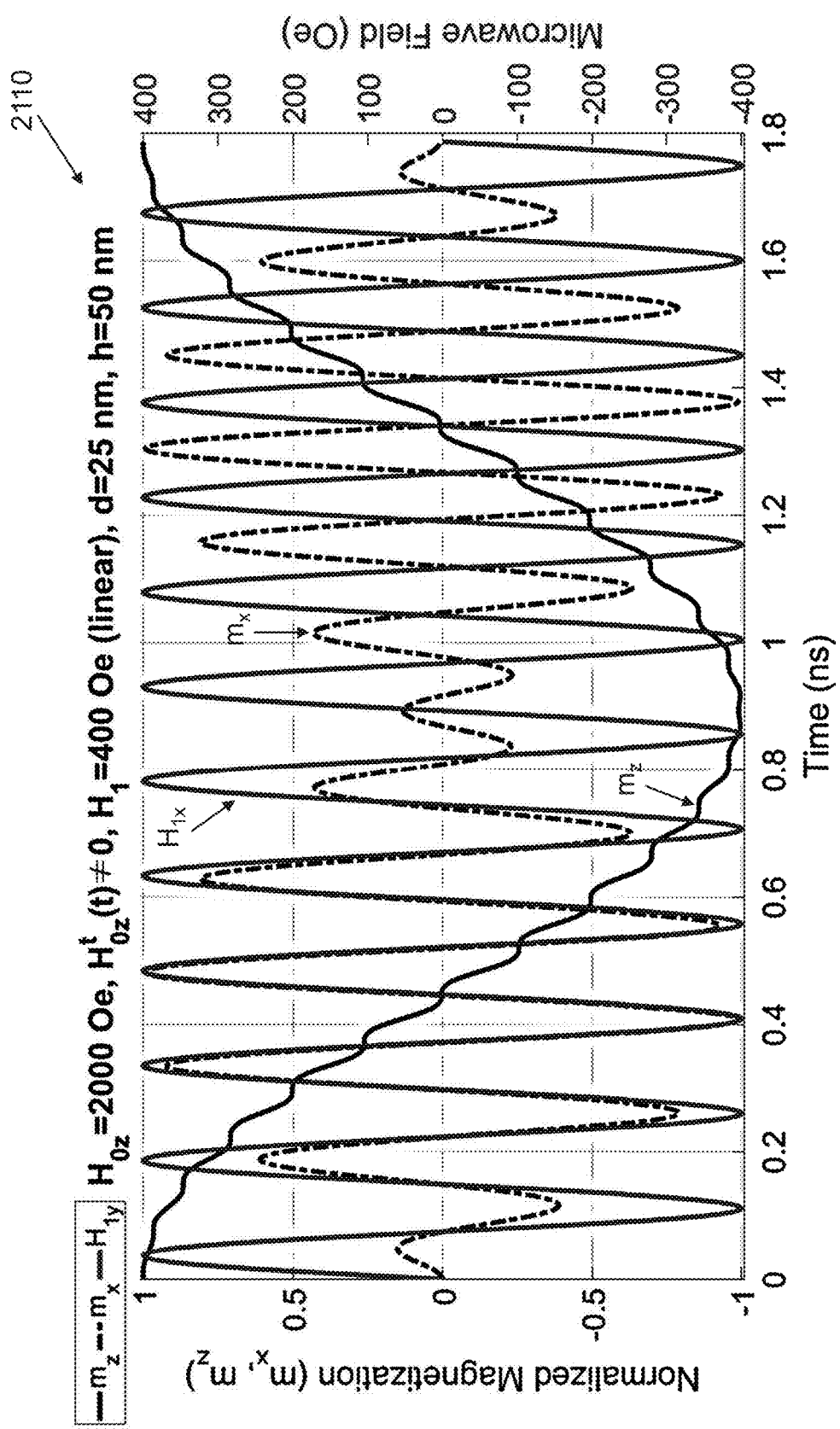
FIG. 21 illustrates an exemplary plot of results from an exemplary magnetic rotation.

FIG. 21 shows an exemplary plot 2110 of results from an exemplary simulation of the magnetization rotation with $H_{0z}=2000$ Oe, $H_1=400$ Oe (linearly polarized in-plane microwave field), d=25 nm, and h=50 nm. $H_1$ was chosen to have the same $t_\pi$ as that for the circularly polarized case. Note the normalized $m_z$ may have a component with twice the precession frequency (e.g., the wiggle on top of the steady rotation). This may arise because the linearly polarized microwave field may be decomposed into two oppositely rotating circularly polarized fields with half the amplitude. This is the field typically used in NMR experiments. FIG. 21 shows a complete 360° rotation, but in the case of $H_{0z}=0$ Oe, $m_z$ may only hit −0.89; hence linearly polarized fields may offer less control over the reversal. This reduction in control may become increasingly severe as the external field approaches the internal demagnetization fields.

XI. Wrap-Up and Conclusion

Figure 22:
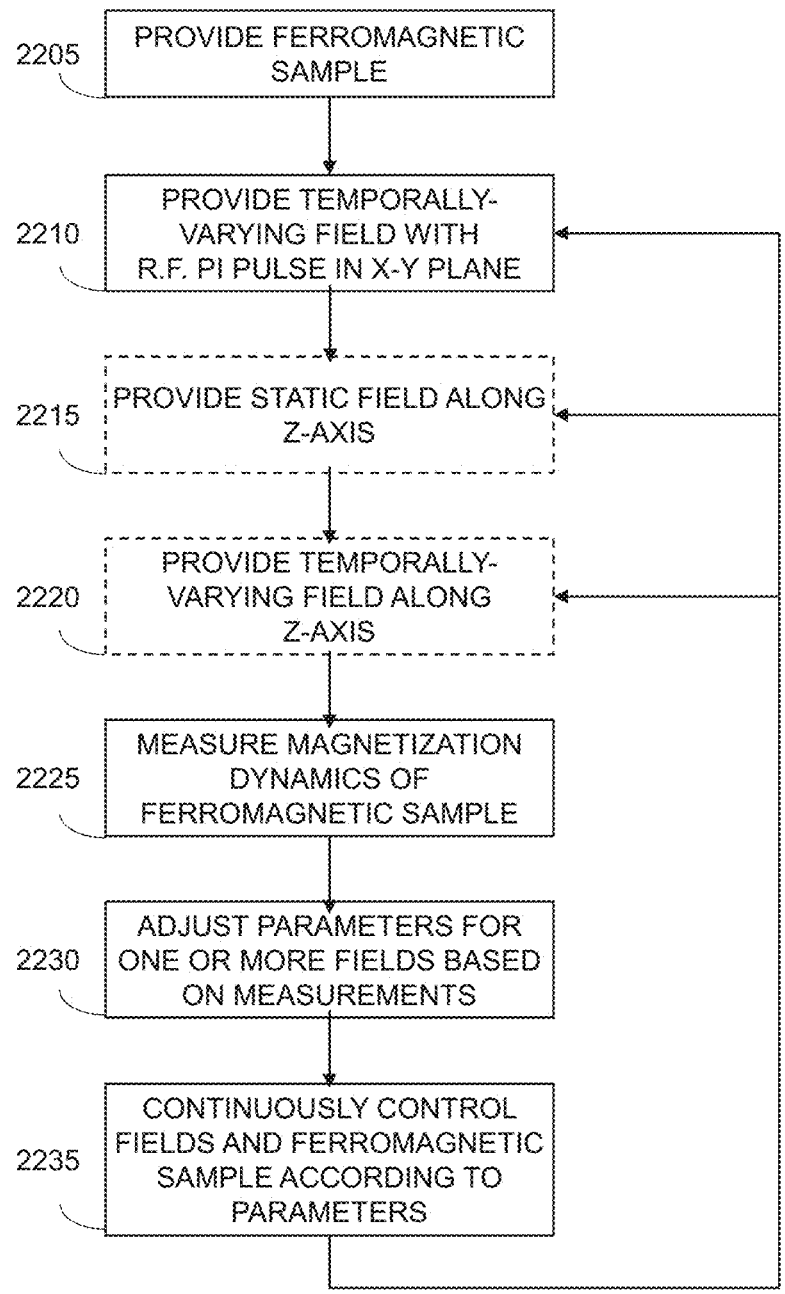
FIG. 22 illustrates a flowchart of an exemplary method for performing magnetization reversals in ferromagnets.

FIG. 22 illustrates a flowchart of an exemplary method 2200 for performing magnetization reversals in ferromagnets. The method 2200 may be performed by a computing processor executing a series of instructions stored in a memory or on a non-transitory machine-readable memory. The method 2200, in various embodiments, may be implemented with fewer or more steps illustrated and described in this example embodiment shown in FIG. 22. Some procedures in the embodiment of the method 2200 may be substituted with others in various instantiations of the method 2200. In various embodiments, operations, method steps, and algorithms discussed elsewhere in this disclosure may be substituted for, added to, and/or combined with any of the operations illustrated in and discussed with reference to FIG. 22.

In an operation 2205, a cylindrical ferromagnetic sample having a height dimension along a z-axis that is larger than a diameter dimension in an x-y plane that is perpendicular to the z-axis may be provided. Providing the ferromagnetic sample may include providing an yttrium iron garnet (YIG) sample having uniaxial shape anisotropy. The x-y plane is defined by an x-axis that is perpendicular to the z-axis and a y-axis that is perpendicular to both the z-axis and the x-axis, as illustrated in FIGS. 1 and 14. Providing the ferromagnetic sample may include providing a ferromagnetic sample having a height dimension along a z-axis that is 150 nm or less and that is at least twice the diameter dimension in the x-y plane. Providing the ferromagnetic sample may include providing a ferromagnetic sample having a height dimension along a z-axis that is 150 nm or less, or 50 nm or less, and that is at least twice the diameter dimension in the x-y plane. Providing the ferromagnetic sample may include providing an yttrium iron garnet (YIG) sample having uniaxial shape anisotropy.

In an operation 2210, a temporally-varying external field comprising an r.f. Pi pulse may be applied to the ferromagnetic sample along a direction perpendicular to the z-axis in the x-y plane. In some embodiments, the r.f. Pi pulse may be chirped. In some embodiments, the r.f. Pi pulse may not be chirped, but may rather be a constant frequency. The x-axis component and a y-axis component of the temporally-varying external field may each have a magnitude that temporally varies according to a different function of time to cause the temporally-varying external field to continuously rotate a precession magnetization vector around the z-axis. The precession magnetization vector is inclined at an angle with respect to the z-axis. The field including the r.f. Pi pulse may be circularly polarized. The field including the r.f. Pi pulse may be linearly polarized. The field comprising the r.f. Pi pulse may have a magnitude of at least 200 Oe.

In an operation 2215, which may be present in some embodiments and omitted in other embodiments, a non-zero static field may be provided along the z-axis. For example, a temporally-varying external field that includes a temporally-varying magnitude of a z-axis component to the ferromagnetic sample may be applied along a direction of the z-axis.

In an operation 2220, which may be present in some embodiments and omitted in other embodiments, a temporally-varying field may be provided along the z-axis.

In an operation 2225, magnetization dynamics of the ferromagnetic sample may be measured. The measurements may be continuous or periodic, for example, with a short period.

In an operation 2230, parameters for one or more fields (e.g., magnitude value, polarization, chirp type and magnitudes, frequencies, etc.) may be continuously or periodically, for example, with a short period and a regular period, updated based on measurement data in operation 2225.

For example, the operation 2230 may include sweeping a frequency of the chirped r.f. Pi pulse based on an instantaneous precession frequency and a corresponding angle of inclination of the precession magnetization vector. Operation 2230 may include sweeping a magnitude of the constant-frequency r.f. Pi pulse based on an instantaneous precession frequency and a corresponding angle of inclination of the precession magnetization vector. Operation 2230 may further include adjusting operational parameters for chirping the r.f. pulse applied to the ferromagnetic sample based on an angular dependence of the precession frequency, as discussed in reference to operation 2210.

In an operation 2235, the fields and ferromagnetic sample may be continuously, or periodically with a short period, controlled by adjusting operational parameters based on the updated parameters from operation 2230. Operational parameters may be adjusted for at least one of the temporally-varying external fields along the z-axis or the x-y plane applied to the ferromagnetic sample based on an angular dependence of the precession frequency. Operation 2235 may include controlling the application of a static non-zero external field to the ferromagnetic sample along a direction of the z-axis via operation 2215. The static non-zero external field may be controlled to have a magnitude of at least 2000 Oe. The applied external field comprising the r.f. Pi pulse may be controlled to have a magnitude of at least 200 Oe.

Figure 23:
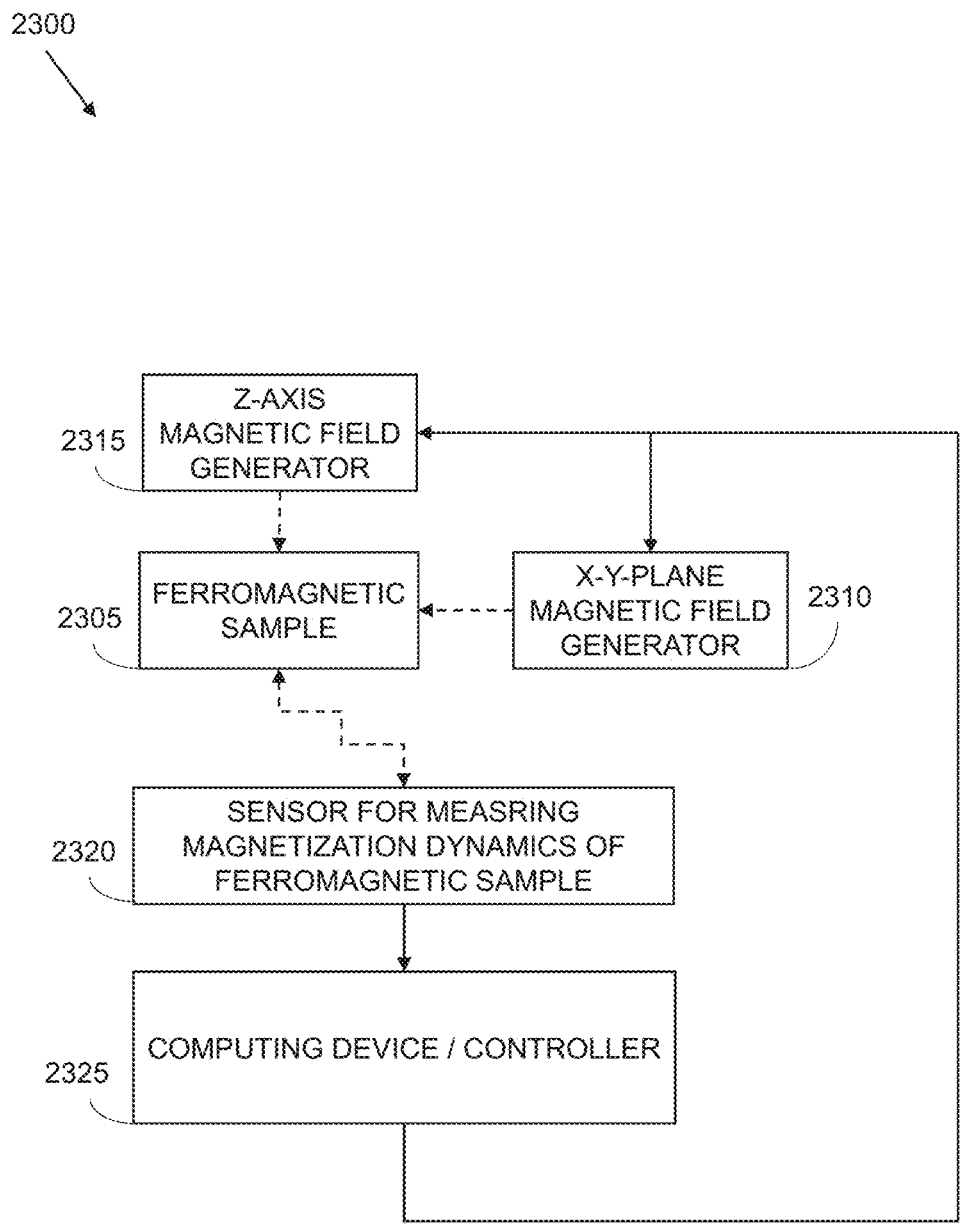
FIG. 23 illustrates a schematic diagram of an exemplary system for performing magnetization reversals in ferromagnets.

FIG. 23 illustrates a schematic diagram of an exemplary system 2300 for performing magnetization reversals in ferromagnets. A cylindrical ferromagnetic sample 2305 may have a height dimension along a z-axis that is larger than a diameter dimension in an x-y plane that is perpendicular to the z-axis. The x-y plane is defined by an x-axis that is perpendicular to the z-axis and a y-axis that is perpendicular to both the z-axis and the x-axis.

An x-y-plane magnetic field generator 2310 may be configured to apply a temporally-varying external field comprising an r.f. Pi pulse to the ferromagnetic sample along a direction perpendicular to the z-axis in the x-y plane. An x-axis component and a y-axis component of the temporally-varying external field may each have a magnitude that temporally varies according to a different function of time to cause the temporally-varying external field to continuously rotate a precession magnetization vector around the z-axis. The precession magnetization vector may be inclined at an angle with respect to the z-axis.

A z-plane magnetic field generator 2315 may be configured to apply a static and/or temporally-varying external field to the ferromagnetic sample along a direction of the z-axis.

A sensor 2320 may measure magnetization dynamics of the ferromagnetic sample.

A computing device/controller (e.g., computing device) 2325 may be configured to control the magnetic field generators 2310 and/or 2315 to continuously vary one or more parameters of a static and/or temporally-varying external field generated by the respective magnetic field generator. For example, the computing device/controller (e.g., computing device) 2325 may control the magnetic field generator 2310 to generate a static and a temporally-varying field that includes an r.f. Pi pulse to the ferromagnetic sample along a direction perpendicular to the z-axis in the x-y plane, based on the sensor 2320's measurements of magnetization dynamics of the ferromagnetic sample 2305.

The above disclosure illustrates that new classes of magnetization reversals, analogous to those routinely performed in NMR, may now be carried out in ferromagnets provided the samples are sufficiently small. It may be desirable to suppress the instability observed in larger samples. The switching technologies described herein may have applications in magnetic recording, for example, by facilitating smaller write fields.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

XII. Appendix: The Perfect Homogeneity Approximation

In the single spin description (SSD), the magnetization texture in the particle M(r, t) may be replaced by a uniform magnetization of magnitude $M_0$ for all times. This approximation may be increasingly accurate as the particle size gets smaller. Even where the approximation is quantitatively imprecise, it is qualitatively accurate in a range of intermediate particle sizes and provides a valuable way of thinking about the reversal phenomena and various experimental protocols. The approximation also has the potential for serving as the starting point for further numerical and analytical investigations when the inhomogeneity is small.

Within this approximation, the energy per unit volume of a right circular cylindrical particle is taken to have the uniaxial form $$E = 2\pi [K_1 M_z^2 + K_2(M_x^2 + M_y^2)] - M \cdot H \quad (A.1)$$

The first term is the dipole-dipole or magneto-static energy, and the second term describes the interaction with an external field $H_a$. The positive dimensionless numbers $K_1$ and $K_2$ describe the anisotropy. This may arise primarily from the shape of the particle, but the anisotropy may also include intrinsic material anisotropy, in which case the omission of terms that break the uniaxial symmetry implicit in Eq. (A.1) may be an additional approximation. (Note that in the case of YIG with the [111] direction coinciding with the z-axis of the cylinder, this approximation is expected to be quite good as the approximation in the x-y plane is broken in sixth order). If the anisotropy were ascribed entirely to shape, $K_1$ and $K_2$ may be the uniaxially symmetric demagnetization coefficients satisfying the sum rule $K_1 + 2K_2 = 1$. Values are given by Sato and Ishii [46] and also by Brown [50], Joseph [51], Aharoni [52]. For a cylinder with a height to diameter ratio of 2:1, $K_1 = 0.182$ and $K_2 = 0.409$; for a ratio of 4:1, $K_1 = 0.098$ and $K_2 = 0.451$. For the analyses discussed in the present disclosure, note that $$K_2 > K_1 > 0 \quad (A.2)$$

so that the z-axis is the easy axis.

With Eq. 1 the effective demagnetization field is given by $$H_d = -\frac{\partial E}{\partial M} = -4\pi(K_1 M_z \hat{z} + K_2(M_x \hat{x} + M_y \hat{y})) \quad (A.3)$$

which lies in the same plane as M and the z-axis. This plane may be referred to as the major plane. That $H_{d,eff}$ lies in this major plane may lead to the existence of a precession frequency $\omega_p(\theta)$ depending on the angle $\theta$ between M and $\hat{z}$ (see Eq. (A.9) below). This feature may break down if the departure from uniaxial symmetry is significant for the free precession of M about the z-axis may then be accompanied by a nutation with a time period that is half the precession period and the instantaneous precession rate may vary with the azimuthal angle φ. To keep the r.f. field perpendicular to M may require the phase of the r.f. to be adjusted very rapidly on times of order $\omega_p^{-1}$ itself, which may not be practical in actual experiments and may violate the nature of a chirped pulse as commonly understood.

Note that $H_d$ in Eq. (A.3) may be an effective demagnetization field. The true field, $H_{true}(r) = B(r) - 4\pi M(r)$, may be non-uniform even if a uniform M is assumed. For example, if $M \Box \hat{z}$, $H_{true}$ may flare out away from the axis near the top of the cylinder and flare inward at the bottom. Furthermore, the nonuniformity may vary as M turns and this variation may not be adequately captured constant $K_1$ and $K_2$ coefficients even within the approximation of a uniform demagnetization [53].

With the energy density given by Eq. (A.1), the Landau-Lifshitz equation for M reads $$\frac{dM}{dt} = -\gamma M \times (H_d + H_0 + H_{rf}(t)) - \frac{\alpha \gamma}{M_0} M \times (M \times (H_d + H_0)). \quad (A.4)$$

Here, the applied field is divided into a static part $H_0$ and a dynamic part $H_{rf}(t)$. Further, we have taken an isotropic g factor, and γ>0, so that magnetic moments of electronic origin may process counterclockwise about an applied magnetic field.

The analysis described herein is performed for $H_0 \Box \hat{z}$. In spherical components $M_z$, $M_\pm = M_x \pm iM_y$, Eq. (A.4) becomes $$\dot{M}_z = -\frac{i\gamma}{2}(M_+ H_{rf,-} - M_- H_{rf,+}) + \frac{\alpha\gamma H_p}{M_0} M_+ M_- \quad (A.5a)$$

$$\dot{M}_+ = i\gamma H_p M_+ - i\gamma M_z H_{rf,+} - \frac{\alpha\gamma H_p}{M_0} M_z M_+ \quad (A.5b)$$

where $$H_p = H_0 + 4\pi(K_2 - K_1)M_z, \quad (A.5c)$$

$$H_{rf,\pm} = H_{rf,x} \pm iH_{rf,y} \quad (A.5d)$$

and the equation for $\dot{M}_-$ may be the complex conjugate of Eq. (A.5b).

Eq.'s (A.5a) and (A.5b) may facilitate observance of free precession immediately. If the r.f. field is turned off and the damping (set α=0) is ignored, Eq. (A.5a) may give $$M_z = \text{const.} \quad (A.6)$$

Indicating the direction of M by polar coordinates θ and φ may mean that the precession angle θ is a constant. Eq (A.5b) may then lead to $$M_+(t) = M_+(0) e^{i\omega_p(\theta)t} \quad (A.7)$$

with $$\omega_p(\theta) = \gamma(H_0 + 2H_a \cos \theta) \quad (A.8)$$

where $$H_a = 2\pi(K_2 - K_1)M_0. \quad (A.9)$$

This is what was disclosed above. The magnetization may process uniformly at a steady frequency $\omega_p(\theta)$.

Next we include a circularly polarized r.f. field $$H_{rf,\pm} = H_1 e^{\pm i\varphi_H(t)} \quad (A.10)$$

and adjust the phase function $\varphi_H(t)$ so that the torque from the r.f. field rotates M(t) away from its initial orientation +M to −M as effectively as possible. From FIG. 1, one may observe that $H_{rf}$ may be maintained at 90° to $M_\perp$. To work with this idea, one may write $$M_+(t) = M_\perp e^{i(\varphi_M(t) - \pi/2)}. \quad (A.11)$$

Eq. (A.5b) may then become $$\frac{dM_\perp}{dt} = (\omega_p - \dot{\varphi}_M) M_\perp + \gamma M_z H_1 e^{i(\varphi_H - \varphi_M)} - \frac{\alpha\omega_p}{M_0} M_z M_\perp \quad (A.12)$$

$$\frac{dM_z}{dt} = -\frac{\gamma}{2} H_1 (M_\perp e^{i(\varphi_M - \varphi_H)} + c.c.) + \frac{\alpha\omega_p}{M_0} |M_\perp|^2. \quad (A.13)$$

The situation shown in FIG. 1 may be obtained by choosing $\varphi_M = \varphi_H$ and $$\dot{\varphi}_M = \omega_p(t). \quad (A.14)$$

The specific choice $$\varphi_M(t) = \varphi_H(t) = \int_0^t \omega_p(t') dt' \quad (A.15)$$

(corresponding to turning on the r.f. in the x direction at $t=0^+$) may facilitate taking $M_\perp$ as real, and Eq.'s (A.14) and (A.15) may simplify to $$\frac{dM_\perp}{dt} = \gamma\left(H_1 - \frac{\alpha H_p(t)}{M_0} M_\perp\right) M_z \quad (A.16a)$$

$$\frac{dM_z}{dt} = -\gamma\left(H_1 - \frac{\alpha H_p(t)}{M_0} M_\perp\right) M_\perp. \quad (A.16b)$$

The reduction of the initial Landau-Lifshitz equation (A.4) to (A.16a) and (A.16b) may be recognized as a transformation to the rotating frame as is commonly done in NMR analysis. The main difference here is that the rate of rotation $\dot{\varphi}_M(t)$ varies with the precession angle θ.

Equations (A.16a) and (A.16b) imply that $M_z^2 + M_\perp^2$ is a constant of motion from which it may further follow that they may be reduced to just one first-order differential equation. The equation may be easily integrated as shown below, but it may be useful to ignore dissipation at first, e.g., set α=0 [54]. Writing $M_z = M \cos \theta$ and $M_\perp = M \sin \theta$, one may find $$\dot{\theta} = \gamma H_1 \quad (A.17)$$

In other words, the tipping angle may grow linearly with time, and the duration of the π pulse is $$T_\pi = \frac{\pi}{\gamma H_1} \text{ (no damping)}. \quad (A.18)$$

One may note that Eq. (A.18) is formally identical to what is found in NMR. Eq. (A.18) may signify that the pulse width is independent of the shape anisotropy (e.g., so long as it is uniaxial) the magnetization magnitude $M_0$ or the static field $H_0$. These quantities may affect other aspects of the r.f. pulse and this conclusion may assume that this pulse may be chirped perfectly. With $\theta(t)=\gamma H_1 t$ the required phase function may be found from Eq.'s (A.8) and (A.15) to be $$\varphi_H(t) = \gamma H_0 t + \frac{2H_a}{H_1} \sin(\gamma H_1 t). \quad (A.19)$$

Note that with perfect chirping, a $\pi$ pulse may be possible even with zero static field, $H_0=0$. In this case, the precession frequency, which is also the frequency of the pulse, may vary as $$\omega_{rf}(t)=2\gamma H_a \cos(\pi t/T_\pi)(H_0=0). \quad (A.20)$$

As explained in Sec. IV, this changes the sign at $t=T_\pi/2$, when the tipping angle is $\pi/2$.

The inclusion of damping may change the above picture quantitatively, but many of the concepts discussed herein still apply, for example, for a zero-static field $\pi$ pulse. Damping may make the system run downhill in energy at all times, and the r.f. field may be configured to be enough to overcome this tendency and push it uphill. Putting $M_z=M_0 \cos\theta$, $M_\perp=M_0 \sin\theta$ in Eq. (A.16b) one may obtain $$\dot{\theta}=\gamma[H_1-\alpha(H_0+2H_a \cos\theta)\sin\theta] \quad (A.21)$$

Integrating, one may find $$\gamma t = \int_0^{\theta(t)} \frac{d\theta'}{H_1 - \alpha(H_0 + 2H_a \cos\theta')\sin\theta'}. \quad (A.22)$$

This may be an implicit equation for $\theta(t)$. The integral may be performed in closed form, but the result may be unilluminating. Further analysis may be most fruitful in two cases: (i) weak damping ($\alpha\ll 1$) and (ii) zero static field ($H_0=0$).

A.1. Weak Damping ($\alpha\ll 1$)

Expanding the integral in powers of $\alpha$, integrating and solving the equation for $\theta(t)$ as a power series yields $$\theta(t) = \quad (A.23)$$
$$\gamma H_1 t - \frac{\alpha}{H_1}\{H_0(1-\cos(\gamma H_1 t)) + \alpha(H_a/2)\sin^2(\gamma H_1 t)\} + O(\alpha^2)$$

This shows how the dissipation-free result, $\theta(t)=\gamma H_1 t$ may be modified. The form of the chirp may be found by substituting (A.23) in (A.9), and integrating. One may find that $$\omega_p(t) = \gamma H_0 + 2\gamma H_a \Big\{ \cos(\gamma H_1 t) + \quad (A.24)$$
$$\frac{\alpha \sin(\gamma H_1 t)}{H_1}[H_0(1-\cos(\gamma H_1 t)) + H_a \sin^2(\gamma H_1 t)]\Big\}$$

One may see that $\omega_p$ develops weak second and third harmonics of $\gamma H_1$. Integrating this form analytically again may be unfruitful and best done numerically, for example, since small relative changes in $\omega_p$ may lead to large changes in the overall phase.

By putting $\theta(t)=\pi$ in Eq. (A.22) and expanding, one may arrive at $$T_\pi = \frac{\pi}{\gamma H_1} + \frac{2\alpha H_0}{\gamma H_1^2} + \alpha^2 \frac{\pi(H_0^2 + H_a^2)}{2\gamma H_1^3} + \ldots . \quad (A.25)$$

Note the small parameter in this expansion is not $\alpha$ but $\alpha H_0/H_1$ and $\alpha H_a/H_1$.

One may also obtain $T_{\pi/2}$, which may turn out to be slightly greater than $T_\pi/2$.

A.2. Zero Static Field ($H_0=0$)

In order for the r.f. field to supply enough energy to overcome the dissipation, the following should be adhered to:

$$u_a \equiv \alpha H_a/H_1 < 1. \quad (A.27)$$

This condition may be taken to be satisfied henceforth. The integral in Eq. (A.22) may be elementary and inverting the resulting implicit equation for $\theta(t)$, one may find that $$\theta(t) = \frac{\tan(\gamma H_1' t)}{\sqrt{1-u_a^2} + u_a \tan(\gamma H_1' t)} \quad (A.28)$$

where $$H_1' = H_1\sqrt{1-u_a^2}. \quad (A.29)$$

From this, one may find the durations of pulses for various special rotation angles:

$$T_{\pi/4} = \frac{1}{\gamma H_1'} \arctan\sqrt{\frac{1+u_a}{1-u_a}}, \quad (A.30a)$$

$$T_{\pi/2} = \frac{1}{\gamma H_1'}\left(\frac{\pi}{2} + \arctan\frac{u_a}{\sqrt{1-u_a^2}}\right), \quad (A.30b)$$

$$T_\pi = \frac{\pi}{\gamma H_1'}. \quad (A.30c)$$

The durations may not be simply proportional. This result may show the nonuniformity of the rotation, which may be weak if $u_a \ll 1$.

XIII. References

[1] E. L. Hahn, "Spin Echoes", Phys. Rev. 80 (4), 580-594 (1950). DOI: 10.1103/PhysRev.80.580.

[2] A. Abragam, The principles of nuclear magnetism (Clarendon Press, Oxford, 1961).

[3] E. Fukushima and S. B. W. Roeder, Experimental pulse NMR: a nuts and bolts approach (Addison-Wesley Pub. Co., Advanced Book Program, Reading, Mass., 1981).

[4] C. P. Slichter, Principles of magnetic resonance, with examples from solid state physics (Harper & Row, New York, 1963).

[5] For a discussion see, R. W. Damon, "Ferromagnetic Resonance at High Power" in Magnetism, edited by G. T. Rado and H. Suhl (Academic Press, New York, 1963), Vol. 1, Chap. 11, pp. 552-620.

[6] P. W. Anderson and H. Suhl, "Instability in the Motion of Ferromagnets at High Microwave Power Levels", Phys. Rev. 100 (6), 1788-1790 (1955). DOI: 10.1103/PhysRev.100.1788.

[7] H. Suhl, "The Nonlinear Behavior of Ferrites at High Microwave Signal Levels", P Ire 44 (10), 1270-1284 (1956). DOI: 10.1109/Jrproc.1956.274950.

[8] H. Suhl, "The Theory of Ferromagnetic Resonance at High Signal Powers", J. Phys. Chem. Solids 1 (4), 209-227 (1957). DOI: 10.1016/0022-3697(57)90010-0.

[9] H. Suhl, "Origin and Use of Instabilities in Ferromagnetic Resonance", J. Appl. Phys. 29 (3), 416-420 (1958). DOI: 10.1063/1.1723162.

[10] J. E. Mercereau and R. P. Feynman, "Physical Conditions for Ferromagnetic Resonance", Phys. Rev. 104 (1), 63-63 (1956). DOI: 10.1103/PhysRev.104.63.

[11] L. R. Walker, "Magnetostatic Modes in Ferromagnetic Resonance", Phys. Rev. 105 (2), 390-399 (1957). DOI: 10.1103/PhysRev.105.390.

[12] L. R. Walker, "Resonant Modes of Ferromagnetic Spheroids", J. Appl. Phys. 29 (3), 318-323 (1958). DOI: 10.1063/1.1723117.

[13] R. W. Damon and J. R. Eshbach, "Magnetostatic Modes of a Ferromagnet Slab", J. Phys. Chem. Solids 19 (3-4), 308-320 (1961). DOI: 10.1016/0022-3697(61)90041-5.

[14] Recently the thin film mode structure predicted by Damon and Eshbach has begun to be resolved in fine detail: see e.g. J. Lim, W. Bang, J. Trossman, A. Kreisel, M. B. Jungfleisch, A. Hoffmann, C. C. Tsai and J. B. Ketterson, "Direct detection of multiple backward volume modes in yttrium iron garnet at micron scale wavelengths", Phys. Rev. B 99 (1), 014435 (2019). DOI: 10.1103/PhysRevB.99.014435.

[15] The frequencies of the Walker-like modes (the first-order Suhl instability) or the mixed dipole-exchange modes (the second-order Suhl instability) in samples of the kind examined here are currently being simulated. For the case of the infinite cylinder analytical results are available: R. Arias and D. L. Mills, "Theory of spin excitations and the microwave response of cylindrical ferromagnetic nanowires", Phys. Rev. B 63 (13), 134439 (2001) and R. I. Joseph, and E. Schlomann, "Theory of Magnetostatic Modes in Long, Axially Magnetized Cylinders", J. Appl. Phys. 32 (6), 1001 (1961).

[16] Thermal stability ultimately sets a lower limit on sample size.

[17] Another issue is that FMR lifetimes are generally much shorter than those encountered in EPR and the spin rotations need to be carried out on a shorter time scale.

[18] M. Krawczyk and D. Grundler, "Review and prospects of magnonic crystals and devices with reprogrammable band structure", J. Phys. Condens. Matter 26 (12), 123202 (2014). DOI: 10.1088/0953-8984/26/12/123202.

[19] S. Jung, B. Watkins, L. DeLong, J. B. Ketterson and V. Chandrasekhar, "Ferromagnetic resonance in periodic particle arrays", Phys. Rev. B 66 (13), 132401 (2002). DOI: 10.1103/PhysRevB.66.132401.

[20] W. Bang, F. Montoncello, M. T. Kaffash, A. Hoffmann, J. B. Ketterson and M. B. Jungfleisch, "Ferromagnetic resonance spectra of permalloy nano-ellipses as building blocks for complex magnonic lattices", J. Appl. Phys. 126 (20), 203902 (2019). DOI: 10.1063/1.5126679.

[21] H. Suto, T. Kanao, T. Nagasawa, K. Mizushima and R. Sato, "Magnetization Switching of a Co/Pt Multilayered Perpendicular Nanomagnet Assisted by a Microwave Field with Time-Varying Frequency", Phys. Rev. Appl. 9 (5), 054011 (2018). DOI: 10.1103/PhysRevApplied.9.054011.

[22] J. G. Zhu, X. C. Zhu and Y. H. Tang, "Microwave assisted magnetic recording", IEEE Trans. Magn. 44 (1), 125-131 (2008). DOI: 10.1109/Tmag.2007.911031.

[23] K. Rivkin, M. Benakli, N. Tabat and H. Q. Yin, "Physical principles of microwave assisted magnetic recording", J. Appl. Phys. 115 (21), 214312 (2014). DOI: 10.1063/1.4882063.

[24] S. Okamoto, N. Kikuchi, M. Furuta, O. Kitakami and T. Shimatsu, "Microwave assisted magnetic recording technologies and related physics", J. Phys. D Appl. Phys. 48 (35), 353001 (2015). DOI: 10.1088/0022-3727/48/35/353001.

[25] K. Rivkin, N. Tabat and S. Foss-Schroeder, "Time-dependent fields and anisotropy dominated magnetic media", Appl. Phys. Lett. 92 (15), 153104 (2008). DOI: 10.1063/1.2907504.

[26] Frequency sweeping and pulse shaping is increasingly being applied in ESR experiments. For a recent example see: S. Probst, V. Ranjan, Q. Ansel, R. Heeres, B. Albanese, E. Albertinale, D. Vion, D. Esteve, S. J. Glaser, D. Sugny and P. Bertet, "Shaped pulses for transient compensation in quantum-limited electron spin resonance spectroscopy", J. Magn. Reson. 303, 42-47 (2019). DOI: 10.1016/j.jmr.2019.04.008.

[27] K. Rivkin and J. B. Ketterson, "Magnetization reversal in the anisotropy-dominated regime using time-dependent magnetic fields", Appl. Phys. Lett. 89 (25), 252507 (2006). DOI: 10.1063/1.2405855.

[28] K. Rivkin and J. B. Ketterson, "Switching spin valves using rf currents", Appl. Phys. Lett. 88 (19), 192515 (2006). DOI: 10.1063/1.2199456.

[29] Z. H. Wang and M. Z. Wu, "Chirped-microwave assisted magnetization reversal", J. Appl. Phys. 105 (9), 093903 (2009). DOI: 10.1063/1.3121075.

[30] M. T. Islam, X. S. Wang, Y. Zhang and X. R. Wang, "Subnanosecond magnetization reversal of a magnetic nanoparticle driven by a chirp microwave field pulse", Phys. Rev. B 97 (22), 224412 (2018). DOI: 10.1103/PhysRevB.97.224412.

[31] The required waveforms can be generated by what is termed an Arbitrary Wave Generator (AWG). In one approach the desired shape is assembled as a sequence of programmed voltages approximating the desired form which is subsequently "conditioned" to smooth out the abrupt jumps. This approach is limited by current digital switching technology to a few giga-Hertz. Hence it would be suitable for switching samples in their own demagnetization field (to be discussed shortly), but not for high external fields. By appropriately triggering two such devices the required circular polarization, together with any mid-pulse phase reversal, can be generated. Another approach to AWG utilizes Direct Digital Synthesis, one component of which uses a sine function look-up table to assemble smoother waveforms. In recording applications, the chirping would be done by dedicated circuitry which could be greatly simplified.

[32] C. L. Jermain, S. V. Aradhya, N. D. Reynolds, R. A. Buhrman, J. T. Brangham, M. R. Page, P. C. Hammel, F. Y. Yang and D. C. Ralph, "Increased low-temperature damping in yttrium iron garnet thin films", Phys. Rev. B 95 (17), 174411 (2017). DOI: 10.1103/PhysRevB.95.174411.

[33] M. J. Donahue and D. G. Porter, OOMMF User's Guide, Version 1.0, Interagency Report NISTIR 6376, (US Department of Commerce, National Institute of Standards and Technology, Gaithersburg, Md., September 1999).

[34] L. D. Landau, E. M. Lifshits and L. P. Pitaevskiĭ, Statistical physics, Part II (Pergamon Press, Oxford; New York, 1980), Section 69.

[35] In reality, the OOMMF code uses Runge-Kutta algorithms of varying orders with or without adaptive step size control.

[36] Y. Li, V. V. Naletov, O. Klein, J. L. Prieto, M. Munoz, V. Cros, P. Bortolotti, A. Anane, C. Serpico and G. de Loubens, "Nutation Spectroscopy of a Nanomagnet Driven into Deeply Nonlinear Ferromagnetic Resonance", Phys. Rev. X 9 (4), 041036 (2019). DOI: 10.1103/PhysRevX.9.041036.

[37] This modification was kindly made by Dr. M. J. Donahue who is a member of the NIST Mathematical Software Group and is one of the code developers.

[38] A. G. Gurevich and G. A. Melkov, Magnetization oscillations and waves (CRC Press, Boca Raton, 1996).

[39] H. Suto, T. Kanao, T. Nagasawa, K. Mizushima and R. Sato, "Zero-dc-field rotation-direction-dependent magnetization switching induced by a circularly polarized microwave magnetic field", Sci. Rep. 7 (1), 13804 (2017). DOI: 10.1038/s41598-017-13770-w.

[40] An implication here is that magnetic writing can be accomplished without a quasi-static switching field. Since chirped reversal is a resonant process it can be carried out more selectively, thereby minimizing the interaction with neighboring bits. Furthermore, bits can be constructed to have differing chirping profiles by altering their shape anisotropy. Multiple bits might then be located (stacked) at the same nominal recording site; as an example, see: H. Suto, T. Nagasawa, K. Kudo, T. Kanao, K. Mizushima and R. Sato, "Layer-Selective Switching of a Double-Layer Perpendicular Magnetic Nanodot Using Microwave Assistance", Phys. Rev. Appl. 5 (1), 014003 (2016). DOI: 10.1103/PhysRevApplied.5.014003.

[41] Our cylindrical samples would be most easy to prepare (pattern) with their z axes perpendicular to a disc surface. They would then be excited in-plane, as was the case before the advent of vertical recording. In place of the usual flat-topped switching field one must then program circularly polarized pulses of the form shown in FIG. 4.

[42] By conventional FMR standards this is a large field, but compared with the write fields used on a hard disc it is quite small; see e.g., T. Schrefl, M. E. Schabes, D. Suess and M. Stehno, "Dynamic micromagnetic write head fields during magnetic recording in granular media", IEEE Trans. Magn. 40 (4), 2341-2343 (2004). DOI: 10.1109/Tmag.2004.832467. The write field modeled there is ≈20 kG and acts for 3 nanoseconds. Our Pi pulse contains only a few cycles and act on a comparable time scale and engineering them should not pose a barrier.

[43] I. N. Krivorotov, D. V. Berkov, N. L. Gorn, N. C. Emley, J. C. Sankey, D. C. Ralph and R. A. Buhrman, "Large-amplitude coherent spin waves excited by spin-polarized current in nanoscale spin valves", Phys. Rev. B 76 (2), 024418 (2007). DOI: 10.1103/PhysRevB.76.024418.

[44] T. Gerrits, M. L. Schneider, A. B. Kos and T. J. Silva, "Large-angle magnetization dynamics measured by time-resolved ferromagnetic resonance", Phys. Rev. B 73 (9), 094454 (2006). DOI: 10.1103/PhysRevB.73.094454.

[45] C. Kittel, "On the Theory of Ferromagnetic Resonance Absorption", Phys. Rev. 73 (2), 155-161 (1948). DOI: 10.1103/PhysRev.73.155.

[46] M. Sato and Y. Ishii, "Simple and Approximate Expressions of Demagnetizing Factors of Uniformly Magnetized Rectangular Rod and Cylinder", J. Appl. Phys. 66 (2), 983-985 (1989). DOI: 10.1063/1.343481.

[47] A. S. Arrott, B. Heinrich, T. L. Templeton and A. Aharoni, "Micromagnetics of Curling Configurations in Magnetically Soft Cylinders", J. Appl. Phys. 50 (3), 2387-2389 (1979). DOI: 10.1063/1.326961.

[48] W. S. Ament and G. T. Rado, "Electromagnetic Effects of Spin Wave Resonance in Ferromagnetic Metals", Phys. Rev. 97 (6), 1558-1566 (1955). DOI: 10.1103/PhysRev.97.1558.

[49] C. Sun and W. M. Saslow, "Strongly coupled modes of M and H for perpendicular resonance", Phys. Rev. B 97 (17), 174411 (2018). DOI: 10.1103/PhysRevB.97.174411.

[50] W. F. Brown, Magnetostatic principles in ferromagnetism (North-Holland Pub. Co.; Interscience Publishers, Amsterdam, N.Y., 1962), Appendix A.

[51] R. I. Joseph, "Ballistic Demagnetizing Factor in Uniformly Magnetized Cylinders", J. Appl. Phys. 37 (13), 4639 (1966). DOI: 10.1063/1.1708110.

[52] A. Aharoni, "Demagnetizing factors for rectangular ferromagnetic prisms", J. Appl. Phys. 83 (6), 3432-3434 (1998). DOI: 10.1063/1.367113.

[53] R. I. Joseph and Schloman. E, "Demagnetizing Field in Nonellipsoidal Bodies", J. Appl. Phys. 36 (5), 1579 (1965). DOI: 10.1063/1.1703091.

[54] This case is also analyzed in [27].

[55] R. Arias and D. L. Mills, "Theory of spin excitations and the microwave response of cylindrical ferromagnetic nanowires", Phys. Rev. B 63 (13), 134439 (2001).

[56] Interagency Report NISTIR 6376, M. J. Donahue and D. G. Porter, OOMMF User's Guide, Version 1.0, Interagency Report NISTIR 6376. (US Department of Commerce, National Institute of Standards and Technology, Gaithersburg, Md., September 1999).

[57] S. Rohart and A. Thiaville, "Skyrmion confinement in ultrathin film nanostructures in the presence of Dzyaloshinskii-Moriya interaction", Phys. Rev. B 88 (18) (2013). ARTN 184422 10.1103/PhysRevB.88.184422

[58] L. D. Landau and E. M. Lifshitz, "On the theory of the dispersion of magnetic permeability in ferromagnetic bodies", Phys. Z. Sowjet. 8, 153-169 (1935).

[59] W. F. Brown, Micromagnetics. (Interscience Publishers, New York, 1963).

[60] J. E. Miltat and M. J. Donahue, "Numerical micromagnetics: finite difference methods" in Handbook of magnetism and advanced magnetic materials, edited by H. Kronmüller and S. Parkin (John Wiley & Sons, Hoboken, N.J., 2007), Vol. 2, pp. 742-764. 10.1002/9780470022184.hmm202

[61] G. S. Abo, Y. K. Hong, J. Park, J. Lee, W. Lee and B. C. Choi, "Definition of Magnetic Exchange Length", IEEE Trans. Magn. 49 (8), 4937-4939 (2013).

[62] H. Y. Carr and E. M. Purcell, "Effects of Diffusion on Free Precession in Nuclear Magnetic Resonance Experiments", Phys. Rev. 94 (3), 630-638 (1954). DOI 10.1103/PhysRev.94.630

What is claimed is:

1. A method for performing magnetization reversals in ferromagnets, the method comprising:
providing a cylindrical ferromagnetic sample having a height dimension along a z-axis that is larger than a diameter dimension in an x-y plane that is perpendicular to the z-axis, the x-y plane defined by an x-axis that is perpendicular to the z-axis and a y-axis that is perpendicular to both the z-axis and the x-axis;
applying a temporally-varying external field comprising a chirped r.f. Pi pulse to the ferromagnetic sample along a direction perpendicular to the z-axis in the x-y plane, an x-axis component and a y-axis component of the temporally-varying external field each having a magnitude that temporally varies according to a different function of time to cause the temporally-varying external field to continuously rotate a precession magnetization vector around the z-axis, the precession magnetization vector being inclined at an angle with respect to the z-axis; and sweeping a frequency of the chirped r.f. Pi pulse based on an instantaneous precession frequency and a corresponding angle of inclination of the precession magnetization vector.

2. The method of claim 1, further comprising applying a static non-zero external field to the ferromagnetic sample along a direction of the z-axis.

3. The method of claim 1, further comprising applying a static non-zero external field having a magnitude of at least 2000 Oe to the ferromagnetic sample along a direction of the z-axis.

4. The method of claim 1, further comprising adjusting operational parameters for chirping the r.f. pulse applied to the ferromagnetic sample based on an angular dependence of the precession frequency.

5. The method of claim 1, wherein providing the ferromagnetic sample comprises providing a ferromagnetic sample having a height dimension along a z-axis that is 150 nm or less and that is at least twice the diameter dimension in the x-y plane.

6. The method of claim 1, wherein providing the ferromagnetic sample comprises providing a ferromagnetic sample having a height dimension along a z-axis that is 50 nm or less and that is at least twice the diameter dimension in the x-y plane.

7. The method of claim 1, wherein providing the ferromagnetic sample comprises providing an yttrium iron garnet (YIG) sample having uniaxial shape anisotropy.

8. The method of claim 1, wherein applying an external field comprising a chirped r.f. Pi pulse comprises applying a circularly polarized field.

9. The method of claim 1, wherein the applied external field comprising the chirped r.f. Pi pulse has a magnitude of at least 200 Oe.

10. A method for performing magnetization reversals in ferromagnets, the method comprising:

providing a cylindrical ferromagnetic sample having a height dimension along a z-axis that is larger than a diameter dimension in an x-y plane that is perpendicular to the z-axis, the x-y plane defined by an x-axis that is perpendicular to the z-axis and a y-axis that is perpendicular to both the z-axis and the x-axis;

applying a temporally-varying external field comprising a constant-frequency r.f. Pi pulse to the ferromagnetic sample along a direction perpendicular to the z-axis in the x-y plane, an x-axis component and a y-axis component of the temporally-varying external field each having a magnitude that temporally varies according to a different function of time to cause the temporally-varying external field to continuously rotate a precession magnetization vector around the z-axis, the precession magnetization vector being inclined at an angle with respect to the z-axis;

applying a temporally-varying external field comprising a temporally-varying magnitude of a z-axis component to the ferromagnetic sample along a direction of the z-axis; and sweeping a magnitude of the constant-frequency r.f. Pi pulse based on an instantaneous precession frequency and a corresponding angle of inclination of the precession magnetization vector.

11. The method of claim 10, wherein applying the temporally-varying external field along a direction perpendicular to the z-axis in the x-y plane comprises applying a circularly polarized field.

12. The method of claim 10, wherein applying the temporally-varying external field along a direction perpendicular to the z-axis in the x-y plane comprises applying a linearly polarized field.

13. The method of claim 10, further comprising adjusting operational parameters for at least one of the temporally-varying external fields along the z-axis or the x-y plane applied to the ferromagnetic sample based on an angular dependence of the precession frequency.

14. The method of claim 10, wherein providing the ferromagnetic sample comprises providing a ferromagnetic sample having a height dimension along a z-axis that is 150 nm or less and that is at least twice the diameter dimension in the x-y plane.

15. The method of claim 10, wherein providing the ferromagnetic sample comprises providing a ferromagnetic sample having a height dimension along a z-axis that is 50 nm or less and that is at least twice the diameter dimension in the x-y plane.

16. The method of claim 10, wherein providing the ferromagnetic sample comprises providing an yttrium iron garnet (YIG) sample having uniaxial shape anisotropy.

17. The method of claim 10, wherein the applied external field comprising the r.f. Pi pulse has a magnitude of at least 200 Oe.

18. A system for reversing a magnetization in a ferromagnet, the system comprising:

a cylindrical ferromagnetic sample having a height dimension along a z-axis that is larger than a diameter dimension in an x-y plane that is perpendicular to the z-axis, where the x-y plane is defined by an x-axis that is perpendicular to the z-axis and a y-axis that is perpendicular to both the z-axis and the x-axis;

a first magnetic field generator is configured to apply a temporally-varying external field comprising an r.f. Pi pulse to the ferromagnetic sample along a direction perpendicular to the z-axis in the x-y plane, an x-axis component and a y-axis component of the temporally-varying external field each having a magnitude that temporally varies according to a different function of time to cause the temporally-varying external field to continuously rotate a precession magnetization vector around the z-axis, the precession magnetization vector being inclined at an angle with respect to the z-axis; and a computer configured to control the magnetic field generator to continuously vary one or more parameters of the temporally-varying external field comprising an r.f. Pi pulse to the ferromagnetic sample along a direction perpendicular to the z-axis in the x-y plane, based on an angular dependence of a precession frequency of the ferromagnetic sample.

19. The system of claim 18, further comprising:

a second magnetic field generator configured to apply one or more of a static external field or a temporally-varying external field comprising to the ferromagnetic sample along the z-axis and perpendicular to the x-y plane.

20. The system of claim 18, further comprising:
a sensor for measuring magnetization dynamics of the ferromagnetic sample;
wherein the computer controls the magnetic field generator based on measurement data received from the sensor.

* * * * *